United States Patent
Spoonhower et al.

(10) Patent No.: US 6,970,488 B2
(45) Date of Patent: Nov. 29, 2005

(54) TUNABLE ORGANIC VCSEL SYSTEM

(75) Inventors: John P. Spoonhower, Webster, NY (US); John A. Agostinelli, Rochester, NY (US); Brian E. Kruschwitz, Rochester, NY (US); Keith B. Kahen, Rochester, NY (US); John A. Lebens, Rush, NY (US)

(73) Assignee: Eastman Kodak Company, Rochester, NY (US)

(*) Notice: Subject to any disclaimer, the term of this patent is extended or adjusted under 35 U.S.C. 154(b) by 244 days.

(21) Appl. No.: 10/272,605

(22) Filed: Oct. 16, 2002

(65) Prior Publication Data

US 2004/0076198 A1 Apr. 22, 2004

(51) Int. Cl.[7] .............................. H01S 3/14; H01S 3/10
(52) U.S. Cl. .......................................... 372/39; 372/20
(58) Field of Search ............................. 372/39, 20, 70, 372/99, 102

(56) References Cited

U.S. PATENT DOCUMENTS

| | | | |
|---|---|---|---|
| 3,573,654 A | | 4/1971 | Smiley |
| 5,491,710 A | * | 2/1996 | Lo .............................. 372/45 |
| 5,881,083 A | | 3/1999 | Diaz-Garcia et al. |
| 5,881,089 A | | 3/1999 | Berggren et al. |
| 5,909,614 A | * | 6/1999 | Krivoshlykov ............... 438/29 |
| 6,160,828 A | | 12/2000 | Kozlov et al. |
| 6,192,062 B1 | * | 2/2001 | Sanchez-Rubio et al. ..... 372/92 |
| 6,194,119 B1 | | 2/2001 | Wolk et al. |
| 6,324,192 B1 | * | 11/2001 | Tayebati ...................... 372/20 |
| 6,438,149 B1 | * | 8/2002 | Tayebati et al. .............. 372/45 |
| 6,658,037 B2 | * | 12/2003 | Kahen et al. ................. 372/70 |
| 6,693,934 B2 | * | 2/2004 | Wang ........................... 372/43 |
| 2001/0036206 A1 | | 11/2001 | Jerman et al. |
| 2002/0031155 A1 | | 3/2002 | Tayebati et al. |
| 2002/0048301 A1 | | 4/2002 | Wang et al. |
| 2002/0061042 A1 | | 5/2002 | Wang et al. |

FOREIGN PATENT DOCUMENTS

| | | | |
|---|---|---|---|
| EP | 1 146 378 A2 | 10/2001 | ........... G02B/26/02 |
| WO | WO 98/50989 | 11/1998 | ............. H01S/3/14 |
| WO | WO 99/34484 | 7/1999 | |

OTHER PUBLICATIONS

"Continuously tunable micro–electromechanical vertical–cavity surface–emitting lasers" by M.C.Larson, A.R. Massengale and J.S. Harris, Jr. *International Journal of Optoelectronics*, 1995, vol. 10, No. 5, pp. 401–408.
U.S. Appl. No. 09/832,759, filed Apr. 11, 2001, Kahen et al.
U.S. Appl. No. 10/066,829, filed Feb. 4, 2002, Kahen.
U.S. Appl. No. 10/066,936, filed Feb. 4, 2002, Kahen et al.
N. Tessler et al., "Pulsed Excitation of Low–Mobility Light–Emitting Diodes: Implication For Organic Lasers," Applied Physics Letters, vol. 74, No. 19, May 10, 1999, pp. 2764–2766.

(Continued)

*Primary Examiner*—Min Sun Harvey
*Assistant Examiner*—James Menefee
(74) *Attorney, Agent, or Firm*—Stephen H. Shaw

(57) ABSTRACT

A system for mechanically tuning optical wavelengths emitted from an organic laser cavity device, that includes: a multi-layered film structure, wherein the multi-layered film structure is pumped by an incoherent source of photons; and a micro-electromechanical mirror assembly proximate to the multi-layered film structure, wherein the micro-electromechanical mirror assembly varies the cavity length of the organic laser cavity device.

52 Claims, 20 Drawing Sheets

OTHER PUBLICATIONS

M. Berggren et al. "Light Amplification In Organic Thin Films Using Cascade Energy Transfer," Letters To Nature, vol. 389, Oct. 2, 1997, pp. 466–469.

N. Tessler et al., "High Peak Brightness Polymer Light–Emitting Diodes," Advanced Materials, 1998, 10, No. 1, pp. 64–68.

J. Schon et al., "An Organic Solid State Injection Laser," Science, vol. 289, Jul. 28, 2000, pp. 599–601.

M. McGehee et al., "Semiconducting Polymer Distributed Feedback Lasers," Applied Physics Letters, vol. 72, No. 13, Mar. 30, 1998, pp. 1536–1538.

C. Chang–Hasnain, "Tunable VCSEL," IEEE Journal On Selected Topics in Quantum Electronics, vol. 6, No. 6, Nov./Dec. 2000, pp. 978–987.

G. Kranzelbinder et al., "Organic Solid–State Lasers," Rep. Prog. Phys. 63 (2000), pp. 729–762.

T. Ishigure et al., "2.5 Gbit/s 100m Data Transmission Using Graded–Index Polymer Optical Fibre and High–Speed Laser Diode at 650 nm Wavelength," Electronics Letters, Mar. 16, 1995, vol. 31, No. 6, pp. 467–469.

S. Kinoshita et al., "Circular Buried Heterostructure (CBH) GaAlAs/GaAs Surface Emitting Lasers," IEEE Journal of Quantum Electronics, vol. QE–23, No. 6, Jun. 1987, pp. 882–888.

K. Choquette et al., "Vertical–Cavity Surface Emitting Lasers: Moving From Research To Manufacturing," Proceedings of the IEEE, vol. 85, No. 11, Nov. 1997, pp. 1730–1739.

C. Wilmsen et al., "Vertical–Cavity Surface–Emitting Lasers," Cambridge University Press, 1999.

L. Fan et al., "10.1 nm Range Continuous Wavelength–Tunable Vertical–Cavity Surface–Emitting Lasers," Electronics Letters, Aug. 18, 1994, vol. 30, No. 17, pp. 1409–1410.

T. Wipiejewski et al., "Tunable Extremely Low Threshold Vertical–Cavity Laser Diodes," IEEE Photonics Technology Letters, vol. 5, No. 8, Aug. 1993, pp. 889–892.

C. Gmachi et al., "Frequency Tuning of a Double–Heterojunction AlGaAs/GaAs–Vertical–Cavity Surface–Emitting Laser by a Serial Integrated In–Cavity Modulator Diode," Appl. Phys. Lett. 62 (3), Jan. 18, 1993, pp. 219–221.

C. Chang–Hasnain, et al. "Continuous Wavelength Tuning Of Two–Electrode Vertical Cavity Surface Emitting Lasers," Electronics Letters, May 23, 1991, vol. 27, No. 11, pp. 1002–1003.

S. Corzine et al., "Design of Fabry–Perot Surface–Emitting Lasers With a Periodic Gain Structure," IEEE Journal of Quantum Electronics, vol. 25, No. 6, Jun. 1989, pp. 1513–1524.

Department of Electrical Engineering and Computer Science (DARPA), Quarterly Progress Report, pp. 1–8 Nov. 2001.

V. Kozlov, et al., "Study of Lasing Action Based on Forster Energy Transfer in Optically Pumped Organic Semiconductor Thin Films," Journal of Applied Physics, vol. 84, No. 8, Oct. 15, 1998, pp. 4096–4108.

E. Avrutin et al., "Control of Surface–Emitting Laser Diodes by Modulating the Distributed Bragg Mirror Reflectivity: Small–Signal Analysis," Appl. Phys. Lett. 63 (18), Nov. 1, 1993, pp. 2460–2462.

F. Sugihwo et al., "Low Threshold Continuously Tunable Vertical–Cavity Surface–Emitting Lasers With 19.1 nm Wavelength Range," Appl. Phys. Lett. 70 (5), Feb. 3, 1997, pp. 547–549.

M. Larson et al., "Wide and Continuous Wavelength Tuning in a Vertical–Cavity Surface–Emitting Laser Using a Micromachined Deformable–Membrane Mirror," Appl. Phys. Lett. 68 (7), Feb. 12, 1996, pp. 891–893.

B. Pezeshki et al., "20m W Widely Tunable Laser Module Using DFB Array and MEMs Selection," Optical Society of America, 2002.

C. Wong et al., "Analog Tunable Gratings—A Piezoelectric Implementation With Nanometer Deformation", no date.

F. Sugihwo et al., "Simultaneous Optimization of Membrane Reflectance and Tuning Voltage for Tunable Vertical Cavity Lasers", no date.

F. Sugihwo et al., "Micromachined Widely Tunable Vertical Cavity Laser Diodes".

B. Pezeshki, "New Approaches to Laser Tuning," Optics & Photonics News, May 2001, pp. 34–38.

* cited by examiner

Electrostatically tuned optical grating.

TUNABLE ORGANIC VCSEL SYSTEM

CROSS-REFERENCE TO RELATED APPLICATIONS

Reference is made to commonly assigned U.S. patent application Ser. No. 09/832,759 filed Apr. 11, 2001 titled "Incoherent Light-Emitting Device Apparatus for Driving Vertical Laser Cavity" by Keith B. Kahen et al.; commonly assigned U.S. patent application Ser. No. 10/066,936 filed Feb. 4, 2002 titled "Organic Vertical Cavity Lasing Devices Containing Periodic Gain Regions" by Keith B. Kahen et al.; and commonly assigned U.S. patent application Ser. No. 10/066,829 filed Feb. 4, 2002 titled "Organic Vertical Cavity Phase-Locked Laser Array Device" by Keith B. Kahen, the disclosures of which are incorporated herein by reference.

FIELD OF THE INVENTION

The invention relates generally to the field of Vertical Cavity Surface Emitting Lasers (VCSEL) or microcavity lasers, and in particular to organic microcavity lasers or organic VCSELs. More specifically, the invention relates to the wavelength tuning of organic laser cavities.

BACKGROUND OF THE INVENTION

Vertical cavity surface emitting lasers (VCSELs) based on inorganic semiconductors (e.g. AlGaAs) have been developed since the mid-80's (Kinoshita et al., IEEE Journal of Quantum Electronics, Vol. QE-23, No. 6, June 1987). They have reached the point where AlGaAs-based VCSELs emitting at 850 nm are manufactured by a number of companies and have lifetimes beyond 100 years (Choquette et al., Proceedings of the IEEE, Vol. 85, No. 11, November 1997). With the success of these near-infrared lasers, attention in recent years has turned to other inorganic material systems to produce VCSELs emitting in the visible wavelength range (Wilmsen et al., *Vertical-Cavity Surface-Emitting Lasers*, Cambridge University Press, Cambridge, 2001). There are many potential applications for visible lasers, such as, display, optical storage reading/writing, laser printing, and short-haul telecommunications employing plastic optical fibers (Ishigure et al., Electronics Letters, Vol. 31, No. 6, Mar. 16, 1995). In spite of the worldwide efforts of many industrial and academic laboratories, much work remains to be done to create viable laser diodes (either edge emitters or VCSELs) that produce light output that spans the visible spectrum.

In an effort to produce visible wavelength VCSELs it would be advantageous to abandon inorganic-based systems and focus on organic-based laser systems, since organic-based gain materials can enjoy a number of advantages over inorganic-based gain materials in the visible spectrum. For example, typical organic-based gain materials have the properties of low unpumped scattering/absorption losses and high quantum efficiencies. In comparison to inorganic laser systems, organic lasers are relatively inexpensive to manufacture, can be made to emit over the entire visible range, can be scaled to arbitrary size and, most importantly, are able to emit multiple wavelengths (such as red, green, and blue) from a single chip. Finally, organic lasers have a very large gain bandwidth, especially in comparison with inorganic lasers. Over the past number of years, there has been increasing interest in making organic-based solid-state lasers. The laser gain material has been either polymeric or small molecule and a number of different resonant cavity structures were employed, such as, microcavity (U.S. Pat. No. 6,160,828 issued Dec. 12, 2000 titled "Organic Vertical-Cavity Surface-Emitting Laser," by Kozlov et al.), waveguide, ring microlasers, and distributed feedback (see also, for instance, Kranzelbinder et al., Rep. Prog. Phys. 63, 729–762, 2000 and U.S. Pat. No. 5,881,083 issued Mar. 9, 1999 titled "Conjugated Polymers As Materials For Solid State Laser"). A problem with all of these structures is that in order to achieve lasing it was necessary to excite the cavities by optical pumping using another laser source. It is much preferred to electrically pump the laser cavities since this generally results in more compact and easier to modulate structures.

A main barrier to achieving electrically pumped organic lasers is the small carrier mobility of organic material, which is typically on the order of $10^{-5}$ cm$^2$/(V–s). This low carrier mobility results in a number of problems. Devices with low carrier mobilities are typically restricted to using thin layers in order to avoid large voltage drops and ohmic heating. These thin layers result in the lasing mode penetrating into the lossy cathode and anode, which causes a large increase in the lasing threshold (Kozlov et al., Journal Of Applied Physics, Vol. 84, Number 8, Oct. 15, 1998). Since electron-hole recombination in organic materials is governed by Langevin recombination (whose rate scales as the carrier mobility), low carrier mobilities result in orders of magnitude having more charge carriers than singlet excitons; one of the consequences of this is that charge-induced (polaron) absorption can become a significant loss mechanism (Tessler et al., Applied Physics Letters, Vol. 74, No. 19, May 10, 1999). Assuming laser devices have a 5% internal quantum efficiency, using the lowest reported lasing threshold to date of ~100 W/cm$^2$ (Berggren et al., Letters to Nature, Vol. 389, Oct. 2, 1997), and ignoring the above mentioned loss mechanisms would put a lower limit on the electrically-pumped lasing threshold of 1000 A/cm$^2$. Including these loss mechanisms would place the lasing threshold well above 1000 A/cm$^2$, which to date is the highest reported current density, which can be supported by organic devices (Tessler et al., Advanced Materials, 1998, 10, No. 1).

One way to avoid these difficulties is to use crystalline organic material instead of amorphous organic material as the lasing media. This approach was recently taken (Schon et al., Science, Vol. 289, Jul. 28, 2000) where a Fabry-Perot resonator was constructed using single crystal tetracene as the gain material. By using crystalline tetracene, larger current densities can be obtained, thicker layers can be employed (since the carrier mobilities are on the order of 2 cm$^2$/(V–s)), and polaron absorption is much lower. Using crystal tetracene as the gain material resulted in room temperature laser threshold current densities of approximately 1500 A/cm$^2$.

An alternative to electrical pumping for organic lasers is optical pumping by incoherent light sources, such as, light emitting diodes (LEDs), either inorganic (McGehee et al., Applied Physics Letters, Vol. 72, No. 13, Mar. 30, 1998) or organic (U.S. Pat. No. 5,881,089 issued Mar. 9, 1999 titled "Article Comprising An Organic Laser" by Berggren et al.). This possibility is the result of unpumped organic laser systems having greatly reduced combined scattering and absorption losses (~0.5 cm$^{-1}$) at the lasing wavelength, especially when one employs a host-dopant combination as the active media. Even taking advantage of these small losses, the smallest reported optically pumped threshold for organic lasers to date is 100 W/cm$^2$ based on a waveguide laser design (Berggren et al., Letters to Nature, Vol. 389, Oct. 2, 1997). Since off-the-shelf inorganic LEDs can only provide up to ~20 W/cm$^2$ of power density, it is necessary to take a different route to avail of optically pumping by incoherent sources. Additionally, in order to lower the lasing threshold it is necessary to choose a laser structure that minimizes the gain volume; a VCSEL-based microcavity laser satisfies this criterion. Using VCSEL-based organic laser cavities should enable optically pumped power density thresholds below 5 W/cm$^2$. As a result, practical organic laser devices can be driven by optically pumping with a variety of readily available, incoherent light sources, such as LEDs.

There are a few disadvantages to organic-based gain media, but with careful laser system design these can be overcome. Organic materials can suffer from low optical and thermal damage thresholds. Devices will have a limited pump power density in order to preclude irreversible damage to the device. Organic materials additionally are sensitive to a variety of environmental factors, like oxygen and water vapor. Efforts to reduce sensitivity to these variables typically result in increased device lifetime.

One of the advantages of organic-based lasers is that since the gain material is typically amorphous, devices can be formed inexpensively when compared to lasers with gain materials that require a high degree of crystallinity (either inorganic or organic materials). Additionally, lasers based upon organic amorphous gain materials can be fabricated over large areas without regard to producing large regions of single crystalline material; as a result they can be scaled to arbitrary size resulting in greater output powers. Because of their amorphous nature, organic-based lasers can be grown on a wide variety of substrates; thus, materials such as glass, flexible plastics, and Si are possible supports for these devices. Thus, there can be significant cost advantages as well as a greater choice in usable support materials for amorphous organic-based lasers.

Tunable inorganic VCSELs are well established in the art. A variety of tuning mechanisms have been described with a wide range of characteristics. Chang-Hasnain (IEEE J. Quant. Electr. 6, 978 (2000)) has recently reviewed advances in wavelength-tunable VCSELs. Micromechanical tunable inorganic VCSELs are emphasized in this article. Continuous wavelength tuning is a feature of micromechanical or microelectromechanical (MEM) means of tuning the wavelength output of solid state laser sources, in particular, inorganic VCSELs. A 15 nm tuning range is described in M. C. Larson and J. S. Harris, Appl. Phys. Lett. 68, 892 (1996) for an inorganic VCSEL with a micromachined, deformable-membrane mirror. With improvements in the movable mirror design, a 19.1 nm tuning range has been demonstrated (Sugihwo et al., Appl. Phys. Lett. 70, Feb. 3, 1997). The physical basis for such MEMs means of tuning is the changing of the optical path length of the laser cavity. The most straightforward method for changing of the optical path length of the laser cavity is movement of the laser cavity mirror. An early version of the use of this tuning mechanism for thin film lasers is described U.S. Pat. No. 3,373,654 issued Mar. 19, 1968 titled "Display Viewing Apparatus" by Carolan et al. More recently, the use of curved movable mirror elements is described for MEM-tunable inorganic VCSELs. Such structures offer improved control of lasing mode quality with single mode operation over a wide tuning range. In particular, U.S. Patent Application Publication Nos. 2002/0048301 (filed Apr. 5, 2000 by Wang et al.); 2002/0031155 (filed Jun. 26, 1998 by Tayebati et al.); and 2002/0061042 (filed Sep. 28, 2001 by Wang et al) provide detailed descriptions of the design of the movable mirror tuning structure.

MEMs devices have been used to tune inorganic laser cavities when used in combination with grating output coupler devices. John H. Jerman et. al. in U.S. Patent Application Publication No. 2001/0036206 (filed Mar. 12, 2001) describe the use of a microactuator to alter the angle of a micro-mirror used to tune a laser with a Littman-Metcalf configuration. The advantage of this particular configuration is that the output light direction is fixed as the wavelength is tuned. This particular cavity configuration is an example of an external cavity laser implemented with MEMs means of wavelength control. Such devices are referred to as MEM-ECL devices. The Littman-Metcalf configuration is but one example of a number of MEM-ECL device laser configurations described in this patent application Publication.

Alternative means for changing the optical path length of the laser cavity for thin film inorganic lasers have been described. These alternative means are generally non-mechanical in nature. The alternative means typically involve affecting the optical path length of a laser cavity via a change in the index of refractive index in one or more portions of the device. Inorganic VCSELs may be tuned by methods that are described as thermal or thermal-electric mechanisms. Both such mechanisms rely on the temperature dependence of the refractive index to affect an optical path length change within the laser cavity. Fan et. al., Electronics Letters, Vol. 30, No. 17, Aug. 18, 1994, reported a tuning range of approximately 10 nm in an inorganic VCSEL device that incorporated an integrated thin film heater. The tuning was accomplished by a completely thermal mechanism. A thermal-electric mechanism is described by Chang-Hasnain et. al. in Electr. Lett. 27, 11, p. 1002 (1991). In this case, an additional structure is incorporated into the inorganic VCSEL, that functions to control the temperature. With appropriate current flow in the device, the laser can be cooled via the Peltier effect leading to a blue wavelength shift of the laser emission. Under other conditions, the current causes a heating of the device and a subsequent red wavelength shift of the laser emission. Low-threshold devices tuned by the heating mechanism are described in Wipiejewski et. al., IEEE Photonics Technology Letters, Vol. 5, No. 8, August 1993. Additionally, there is a tuning mechanism that is a consequence of the concentration of free electronic carriers in the laser cavity, the so-called plasma effect (see, for example, Gmachi et al., Appl. Phys. Lett., 62 (3), January 1993). The carrier density causes a decrease of refractive index and a decrease of the laser output wavelength. The tuning range is quite limited in these devices. These methods also suffer from a limited frequency response for the modulation; the tuning rate is rather small.

A number of other methods of inorganic VCSEL wavelength control have been reported that rely upon refractive index changes to affect a tuning. E. A. Avrutin et. al. in Appl. Phys. Lett. 63(18), p. 2460 (1993) describe the incorporation of index-changing layer or layers in the distributed Bragg reflector (DBR) portion of the device. The DBR typically forms one of the end mirrors that define the laser cavity.

MEMs devices may be used to select the output of different laser oscillators as opposed to tuning laser cavities either by changing the optical path length of a laser cavity or affecting an angle change with a grating output coupler. A widely tunable laser module is described in B. Pezeshki et. al., *Optical Fiber Communication Conference (OFC) Proceedings Technical Digest Postconference Edition, volume 70*, March 2002, Optical Society of America. An array of multi-wavelength lasers produces light outputs at discrete wavelengths within a wavelength tuning range. The output of a single laser cavity device is selected by optics and a MEMs tilt mirror to direct the appropriate, selected wavelength output to an output optical fiber. Wavelength selection is accomplished by control of the MEMs tilt mirror angle within the system.

Kozlov et al., in U.S. Pat. No. 6,160,828 (Dec. 12, 2000) describe organic VCSEL devices with a capability for wavelength tuning. Like the inorganic material-based systems described above, the optical path length of the laser cavity is changed to affect wavelength tuning. Two different embodiments are described. In the first, the laser organic layer that provides optical gain, is in the form of a wedge or tapered layer. The thickness of the organic layer varies laterally in the device. Optically pumping different portions of the wedge device produces outputs at different wavelengths. Smooth tuning ranges for such organic devices are significantly greater than for inorganic devices; tuning ranges of 50 nm or more are reported. In an alternative embodiment, the second (top) mirror element is translated with respect to the rest of the device structure to produce an optical path length change. A lens is incorporated into the cavity to direct the light to the second mirror element. With both such devices it is difficult to control the lateral mode structure of the lasing emission, as the active volume in the cavity is only determined by the pump beam spot size. In the wedge device, the spectral width of the laser output is also sensitive to the pump beam spot size in such a device structure. Additionally, in the case where a lens is incorporated into the cavity, such an extended length cavity has many longitudinal modes. It is difficult to perform smooth cavity tuning in such structures. The addition of the lens adds cost and complexity to the system and complicates the optical alignment.

What is needed is better laser optical mode control and tuning wavelength control of organic tunable VCSELs while maintaining the great tuning range advantage of organic tunable VCSELs over inorganic VCSELs.

SUMMARY OF THE INVENTION

The present invention is directed to meeting one or more of the needs set forth above. Briefly summarized, according to one embodiment of the present invention, we describe a system for mechanically tuning optical wavelengths emitted from an organic laser cavity device, that includes: a multi-layered film structure, wherein the multi-layered film structure is pumped by an incoherent source of photons; and a micro-electromechanical mirror assembly proximate to the multi-layered film structure, wherein the micro-electromechanical mirror assembly varies the cavity length of the organic laser cavity device.

According to another embodiment of the present invention, directed to meet one or more of the aforementioned needs, we describe a system for tuning optical wavelengths emitted from an organic laser cavity device, that includes: an organic laser cavity structure pumped by a means of excitation, wherein the organic laser cavity structure includes: a support; a first dielectric stack for receiving and transmitting pump beam light and being reflective to laser light over a predetermined range of wavelengths; one or more dielectric control layers with controllable index of refraction; an organic active region for receiving transmitted pump beam light from the first dielectric stack and emits the laser light; a second dielectric stack for reflecting transmitted pump beam light and laser light from the organic active region back into the organic active region, wherein a combination of the first and the second dielectric stacks and the organic active region produces the laser light; and means for controlling the index refraction of the dielectric control layers.

BRIEF DESCRIPTION OF THE DRAWINGS

Other features and advantages of the present invention will become more apparent when taken in conjunction with the following description and drawings wherein identical reference numerals have been used, where possible, to designate identical features that are common to the figures, and wherein.

To facilitate understanding, identical reference numerals have been used, where possible, to designate identical elements that are common to the figures.

DETAILED DESCRIPTION OF THE INVENTION

In the present invention, the terminology describing vertical cavity organic laser devices (VCSELs) may be used interchangeably in a short hand fashion as "organic laser cavity devices." Organic laser cavity structures can be fabricated as large area structures with a plurality of organic laser cavity devices and can be optically pumped with light emitting diodes (LEDs).

Figure 1:
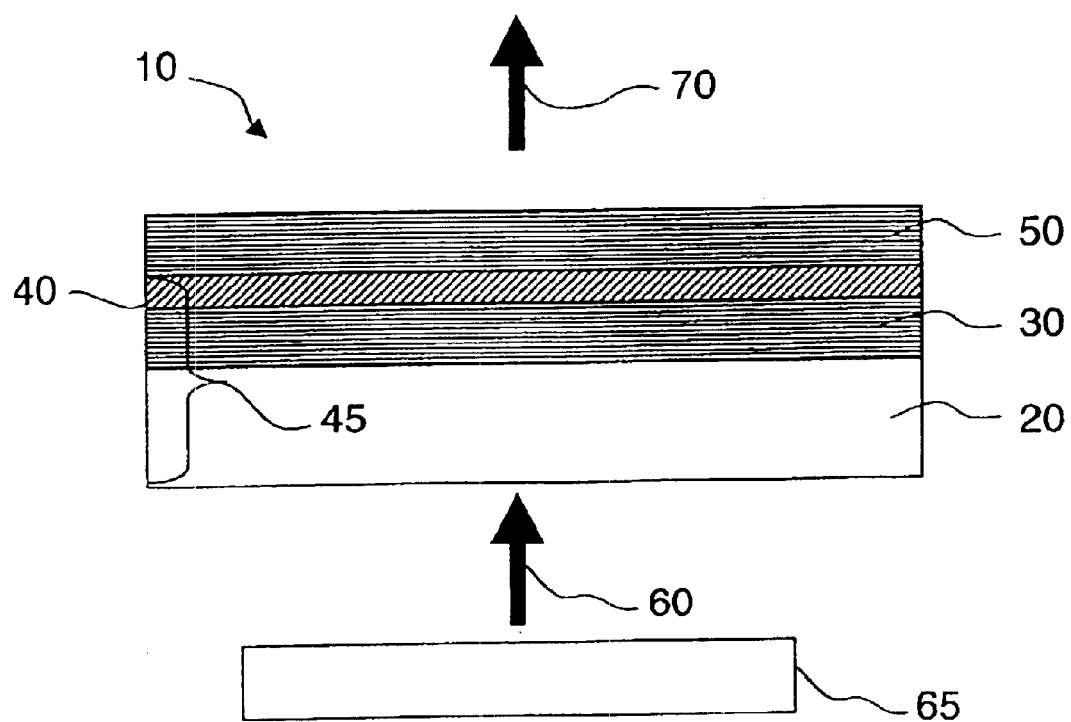
FIG. 1 is a cross-section side view of an optically pumped organic laser cavity device.

A cross-section side view of a vertical cavity organic laser device 10 is shown in FIG. 1. The substrate 20 can either be light transmissive or opaque, depending on the intended direction of optical pumping or laser emission. Light transmissive substrates 20 may be transparent glass, plastic, or other transparent materials such as sapphire. Alternatively, opaque substrates including, but not limited to, semiconductor material (e.g. silicon) or ceramic material may be used in the case where both optical pumping and emission occur through the same surface. On the substrate 20 is deposited a bottom dielectric stack 30 followed by an organic active region 40. The substrate 20, the bottom dielectric stack 30, and the organic active region 40 constitute a multi-layered film structure 45. A top dielectric stack 50 is then deposited on the multi-layered film structure 45. A pump beam 60 optically pumps the vertical cavity organic laser device 10. The pump beam 60 originates from a source of photons 65. The source of photons 65 for the pump beam 60 may be incoherent, such as emission from a light-emitting diode (LED). Alternatively, the pump beam may originate from a coherent laser source. FIG. 1 shows laser emission 70 from the top dielectric stack 50. Alternatively, the laser device could be optically pumped through the top dielectric stack 50 with the laser emission through the substrate 20 by proper design of the dielectric stack reflectivities. In the case of an opaque substrate, such as silicon, both optical pumping and laser emission occur through the top dielectric stack 50.

The preferred material for the organic active region 40 is a small molecular weight organic host-dopant combination typically deposited by high vacuum thermal evaporation. These host-dopant combinations are advantageous since they result in very small unpumped scattering/absorption losses for the gain media. It is preferred that the organic molecules be of small molecular weight since vacuum-deposited materials can be deposited more uniformly than spin-coated polymeric materials. It is also preferred that the host materials used in the present invention are selected such that they have sufficient absorption of the pump beam 60 and are able to transfer a large percentage of their excitation energy to a dopant material via Förster energy transfer. Those skilled in the art are familiar with the concept of Förster energy transfer, which involves a radiationless transfer of energy between the host and dopant molecules. An example of a useful host-dopant combination for red-emitting lasers is aluminum tris(8-hydroxyquinoline) (Alq) as the host and [4-(dicyanomethylene)-2-t-butyl-6-(1,1,7,7-tetramethyljulolidyl-9-enyl)-4H-pyran] (DCJTB) as the dopant (at a volume fraction of 1%). Other host-dopant combinations can be used for other wavelength emissions. For example, in the green a useful combination is Alq as the host and [10-(2-benzothiazolyl)-2,3,6,7-tetrahydro-1,1,7,7-tetramethyl-1H,5H,11H-[1]Benzopyrano[6,7,8-ij] quinolizin-11-one] (C545T) as the dopant (at a volume fraction of 0.5%). Other organic gain region materials can be polymeric substances, e.g., polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 issued Feb. 27, 2001 titled "Thermal Transfer Element And Process For Forming Organic Electroluminescent Devices" and referenced herein. It is the purpose of the organic active region 40 to receive transmitted pump beam light 60 and emit laser light. In the absence of either the bottom dielectric stack 30 or the top dielectric stack 50, the organic active region produces spontaneous emission.

The bottom and top dielectric stacks 30 and 50, respectively, are preferably deposited by conventional electron-beam deposition and can comprise alternating high index and low index dielectric materials, such as, $TiO_2$ and $SiO_2$, respectively. Other materials, such as $Ta_2O_5$ for the high index layers, could be used. The bottom dielectric stack 30 is deposited at a temperature of approximately 240° C. During the top dielectric stack 50 deposition process, the temperature is maintained at around 70° C. to avoid melting the organic active materials. In an alternative embodiment of the present invention, the top dielectric stack is replaced by the deposition of a reflective metal mirror layer. Typical metals are silver or aluminum, which have reflectivities in excess of 90%. In this alternative embodiment, both the pump beam 60 and the laser emission 70 would proceed through the substrate 20. Both the bottom dielectric stack 30 and the top dielectric stack 50 are reflective to laser light over a predetermined range of wavelengths, in accordance with the desired emission wavelength of the vertical cavity organic laser device 10.

The use of a vertical microcavity with very high finesse allows a lasing transition at a very low threshold (below 0.1 $W/cm^2$ power density). This low threshold enables incoherent optical sources to be used for the pumping instead of the focused output of laser diodes, which is conventionally used in other laser systems. An example of a pump source is a UV LED, or an array of UV LEDs, e.g. from Cree (specifically, the XBRIGHT® 900 UltraViolet Power Chip® LEDs). These sources emit light centered near 405 nm wavelength and are known to produce power densities on the order of 20 $W/cm^2$ in chip form. Thus, even taking into account limitations in utilization efficiency due to device packaging and the extended angular emission profile of the LEDs, the LED brightness is sufficient to pump the laser cavity at a level many times above the lasing threshold.

Figure 2:
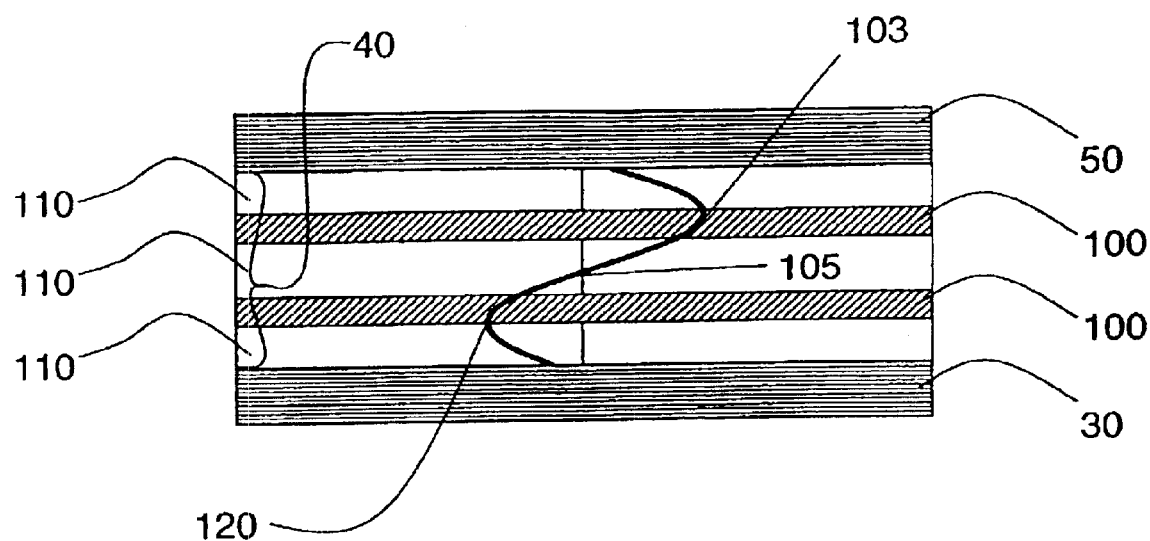
FIG. 2 is a cross-section side view of an optically pumped organic based vertical cavity laser with a periodically structured organic gain region.

The efficiency of the laser is improved further using an active region design as depicted in FIG. 2 for the vertical cavity organic laser device 80. The organic active region 40 includes one or more periodic gain regions 100 and organic spacer layers 110 disposed on either side of the periodic gain regions 100 and arranged so that the periodic gain regions 100 are aligned with antinodes 103 of the device's standing wave electromagnetic field. This is illustrated in FIG. 2 where the laser's standing electromagnetic field pattern 120 in the organic active region 40 is schematically drawn. Since stimulated emission is highest at the antinodes 103 and negligible at nodes 105 of the electromagnetic field, it is inherently advantageous to form the active region 40 as shown in FIG. 2. The organic spacer layers 110 do not undergo stimulated or spontaneous emission and largely do not absorb either the laser emission 70 or the pump beam 60 wavelengths. An example of a spacer layer 110 is the organic material 1,1-Bis-(4-bis(4-methyl-phenyl)-amino-phenyl)-cyclohexane (TAPC). TAPC works well as the spacer material since it largely does not absorb either the laser emission 70 or the pump beam 60 energy and, in addition, its refractive index is slightly lower than that of most organic host materials. This refractive index difference is useful since it helps in maximizing the overlap between the electromagnetic field antinodes and the periodic gain region(s) 100. As will be discussed below with reference to the present invention, employing periodic gain region(s) 100 instead of a bulk gain region results in higher power conversion efficiencies and a significant reduction of the unwanted spontaneous emission. The placement of the periodic gain region(s) 100 is determined by using the standard matrix method of optics (Corzine et al. IEEE J. Quant. Electr. 25, 1513 [1989]). To get good results, the thicknesses of the periodic gain region(s) 100 need to be at or below 50 nm in order to avoid unwanted spontaneous emission.

Figure 3:
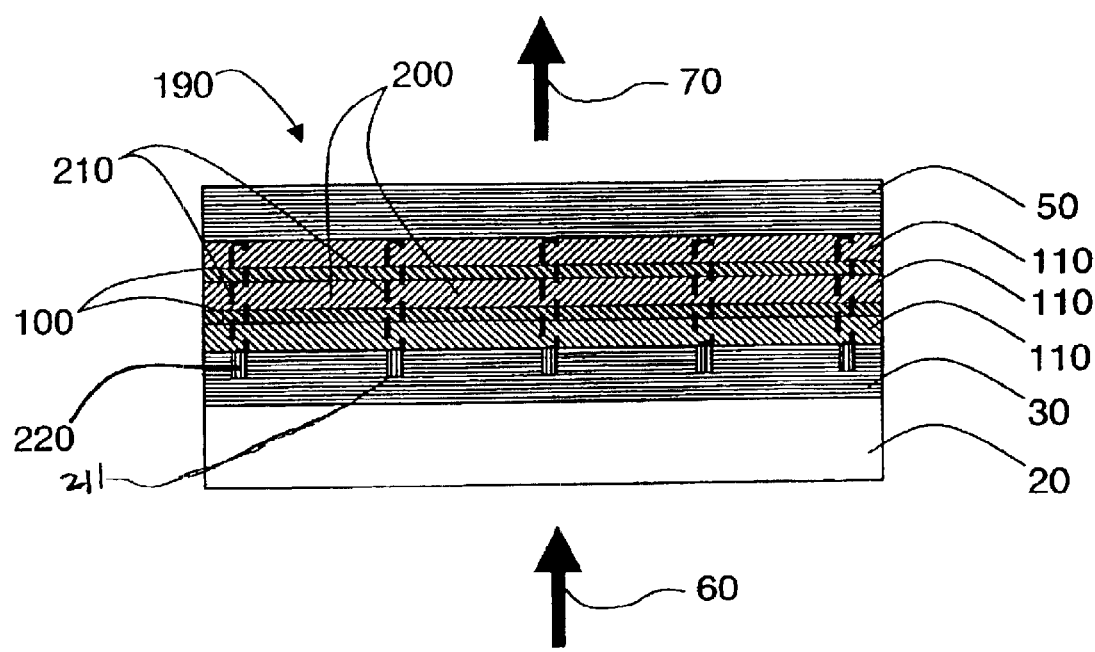
FIG. 3 is a cross-section side view of an optically pumped two-dimensional phase-locked organic vertical cavity laser array device.

The laser can be increased in area while maintaining a degree of spatial coherence by utilizing the phase-locked organic laser array device 190 as depicted in FIG. 3. In order to form a two-dimensional phase-locked organic laser array device 190, organic laser cavity devices 200 separated by inter-pixel regions 210 need to be defined on the surface of the VCSEL. To obtain phase locking, intensity and phase information must be exchanged amongst the organic laser cavity devices 200. This is best obtained by weakly confining the laser emissions to the device regions by either small amounts of built-in index or gain guiding, e.g. by modulating the reflectance of one of the mirrors. In one embodiment, the reflectance modulation was affected by patterning and forming an etched region 220 in the bottom dielectric stack 30, using standard photolithographic and etching techniques, thus forming a two-dimensional array of circular pillars 211 on the surface of the bottom dielectric stack 30. The remainder of the organic laser microcavity device structure is deposited upon the patterned bottom dielectric stack 30 as described above. In one embodiment, the shape of the laser pixels is circular; however, other pixel shapes are possible, such as rectangular, for example. The inter-pixel spacing is in the range of 0.25 to 4 $\mu$m. Phase-locked array operation also occurs for larger inter-pixel spacing; however, it leads to inefficient usage of the optical-pumping energy. The etch depth is preferred to be from 200 to 1000 nm deep to form etched region 220. By etching just beyond an odd number of layers into the bottom dielectric stack 30, it is possible to affect a significant shift of the longitudinal mode wavelength in the etched region away from the peak of the gain media. Hence, lasing action is prevented and spontaneous emission is significantly reduced in the inter-pixel regions 210. The end result of the formation of etched region 220 is that the laser emission is weakly confined to the organic laser cavity devices 200, no lasing originates from the inter-pixel regions 210, and coherent phase-locked laser light is emitted by the phase-locked organic laser array device 190.

Figure 4A:
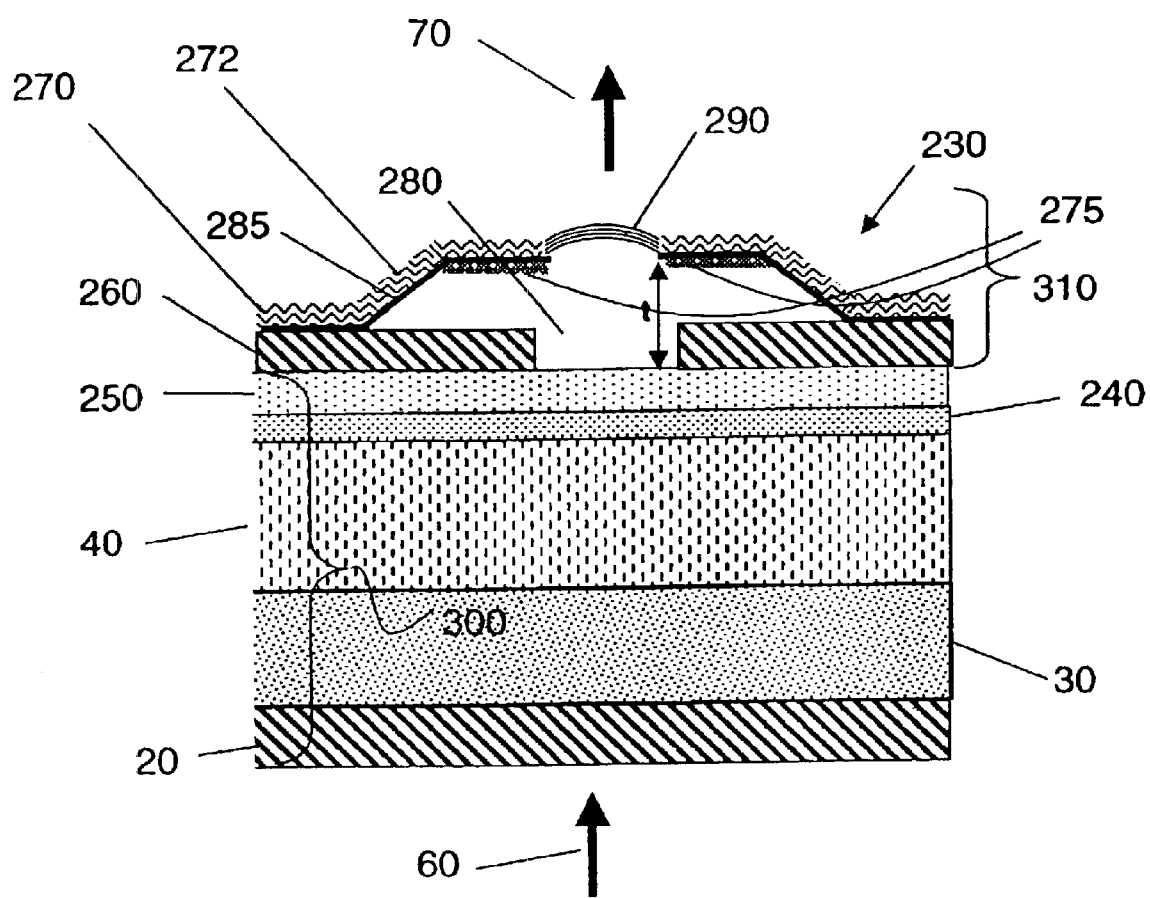
FIG. 4a is a cross-section side view of an optically pumped tunable organic VCSEL system with MEMs device for changing the optical path length of the laser cavity.

FIG. 4a is a cross-section side view of an optically pumped tunable organic VCSEL system 230 with MEMs device for changing the optical path length of the laser cavity. The system 230 is best described by considering two separate subsystems: the multi-layered film structure 300; and the micro-electromechanical mirror assembly 310. The multi-layered film structure 300 consists of the substrate 20, the bottom dielectric stack 30, the organic active region 40, and one or more index matching layers 240 and 250. In this case, the substrate 20 is transmissive for light of the pump beam 60. Pump beam 60 light is received by the multi-layered film structure 300 and produces spontaneous emission. The top dielectric stack 290 and the bottom dielectric stack 30 constitute the end mirrors of the organic laser cavity. The micro-electromechanical mirror assembly 310 consists of a bottom electrode 260, a support structure 270, a top electrode 275, support arms 272, an air gap 280, a mirror tether 285, and the top dielectric stack 290. Laser emission 70 occurs from the top dielectric stack 290. A voltage source (not shown) applied between the bottom electrode 260 and the top electrode 275 changes the thickness t, of the air gap 280 via electrostatic interaction and thereby varies the cavity length of the organic laser cavity device. This variation of the organic laser cavity length causes a wavelength variation of the optically pumped tunable organic VCSEL system 230. Although the top dielectric stack 290 is depicted as having a finite curvature, those skilled in the art would recognize that substantially flat top dielectric stacks 290 may also be used and should be considered another embodiment of the present invention. Without the weak confinement of the laser emissions to the device regions by modulating the reflectance of one of the mirrors as depicted in FIG. 3, it is difficult to obtain fundamental single mode operation in a VCSEL. Thus the curved top dielectric stack 290 would be advantageous in those applications where lateral mode control is important or where lateral confinement structures, as has been already described, are not employed. The cavity depicted in FIG. 4a is described as half-symmetric and is a member of a class of Fabry-Perot cavity structures. Output wavelengths for this cavity are governed by the mathematical relationship $$n\lambda/2 = L_{opt}$$

where n is an integer, $\lambda$ is the wavelength and $L_{opt}$ is the single-pass optical path length in the cavity. Variation of t, the thickness of the air gap 280, changes the optical path length. The top dielectric stack 290 may include one or more index matching layers; these are not shown in FIG. 4a. These index matching layers (including index matching layers 240 and 250) minimize optical reflections at the air gap 280 interface with adjacent layers and improve the efficiency of the device. The bottom electrode 260 and the top electrode 275 are fabricated from conductive materials, typically metals, and in a ring geometry. Transparent conductive electrodes, such as indium-tin-oxide (ITO) or polymer materials could also be used. If the optical losses of such latter materials are low, a ring geometry may not be required. Support structure 270 is typically aluminum, titanium tungsten (Ti—W), or silicon nitride ($SiN_x$) with sufficient thickness to provide mechanical support. Typical thicknesses are 2000 nm for the support structure 270 and 100–200 nm for the mirror tether 285. The mirror tether 285 is made from similar materials but much thinner in order to be flexible under the action of the electrostatic field provided by the tuning voltage source. It may be necessary to have an additional electrical isolation layer (not shown) between the bottom electrode 260 and the mirror tether 285. This layer is fabricated from insulating material. The support structure 270 defines at least one support arm 272, which mechanically stabilizes the top dielectric stack 290 at the required distance t. In order to accomplish this, the support structure 270 must have a suitably large intrinsic tensile stress.

Figure 4B:
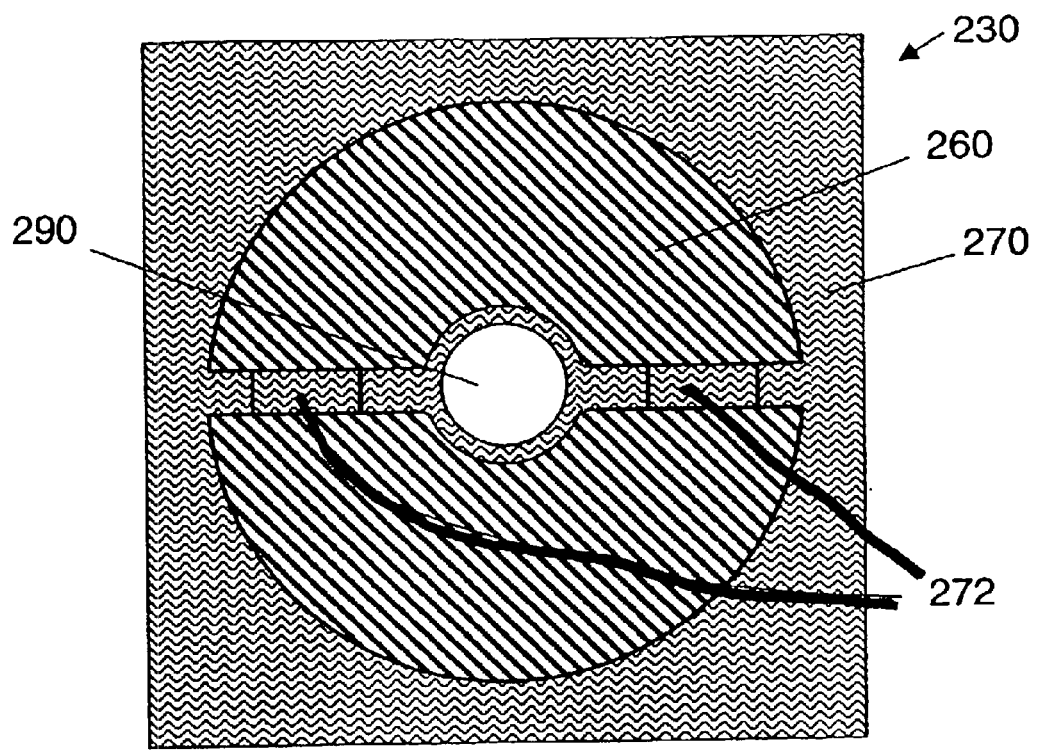
FIG. 4b is a top view of an optically pumped tunable organic VCSEL system, using a doubly supported beam structure.

The geometry of the support structure is illustrated in FIGS. 4b–4e. FIG. 4b is a top view schematic of the optically pumped tunable organic VCSEL system 230, using a doubly supported beam structure. The top dielectric stack 290 is visible in the center of the structure, and is mechanically supported by two support arms 272 disposed on opposite sides of the top mirror stack 290. The two support arms 272 are formed by etching through the support structure 270 in the regions shown and subsequently removing a sacrificial material to form the air gap 280 as shown in FIG. 4a. The bottom electrode 260 is visible in the regions where the support structure 270 was etched.

Figure 4C:
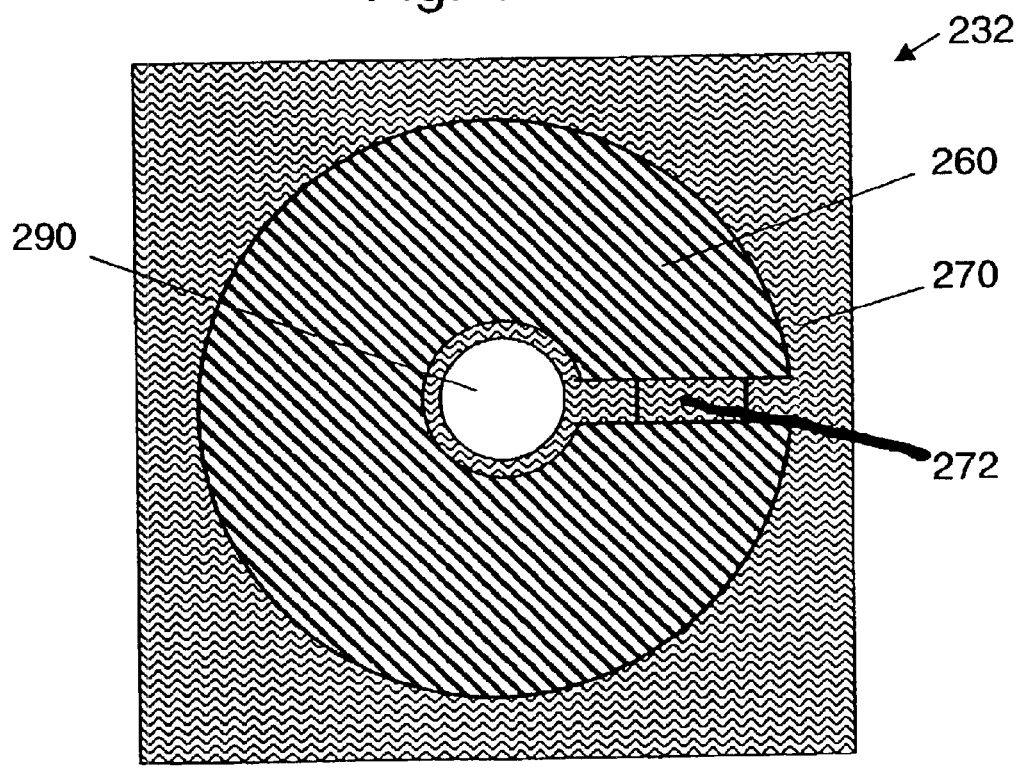
FIG. 4c is a top view of an alternative embodiment of an optically pumped tunable organic VCSEL system, which uses a cantilever structure.

FIG. 4c is a top view of an alternative embodiment of an optically pumped tunable organic VCSEL system 232, which uses a cantilever structure. The cross-section of the optically pumped tunable organic VCSEL system 232 is identical to that in FIG. 4a. The top dielectric stack 290 is visible in the center of the structure, and is mechanically supported by a single support arm 272 disposed on one side of the top dielectric stack 290. The support arm 272 is formed by etching through the support structure 270 in the regions shown and subsequently removing a sacrificial material to form the air gap 280 as shown in FIG. 4a. The bottom electrode 260 is visible in the regions where the support structure 270 was etched.

Figure 4D:
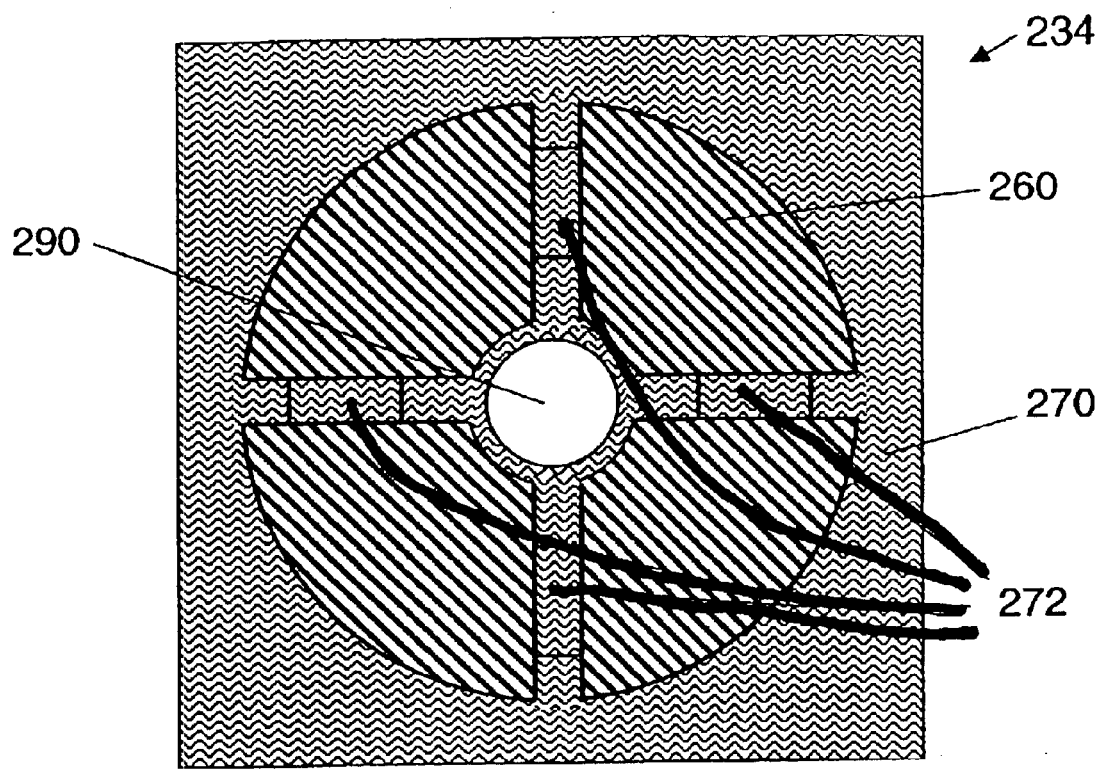
FIG. 4d is a top view of yet another embodiment of an optically pumped tunable organic VCSEL system, which uses a multiple (greater than two) beam structure.

FIG. 4d is a top view of yet another embodiment of an optically pumped tunable organic VCSEL system 234, which uses a multiple (greater than two) beam structure. The cross-section of the optically pumped tunable organic VCSEL system 234 is identical to that in FIG. 4a. The top dielectric stack 290 is visible in the center of the structure, and is mechanically supported by a plurality of support arms 272 disposed approximately symmetrically on the sides of the top dielectric stack 290. The support arms 272 are formed by etching through the support structure 270 in the regions shown and subsequently removing a sacrificial material to form the air gap 280 as shown in FIG. 4a. The bottom electrode 260 is visible in the regions where the support structure 270 was etched. Note that whereas the embodiment in FIG. 4d shows four support arms 272, three or more than four support arms 272 can be used, and are considered to be within the scope of the invention.

Figure 4E:
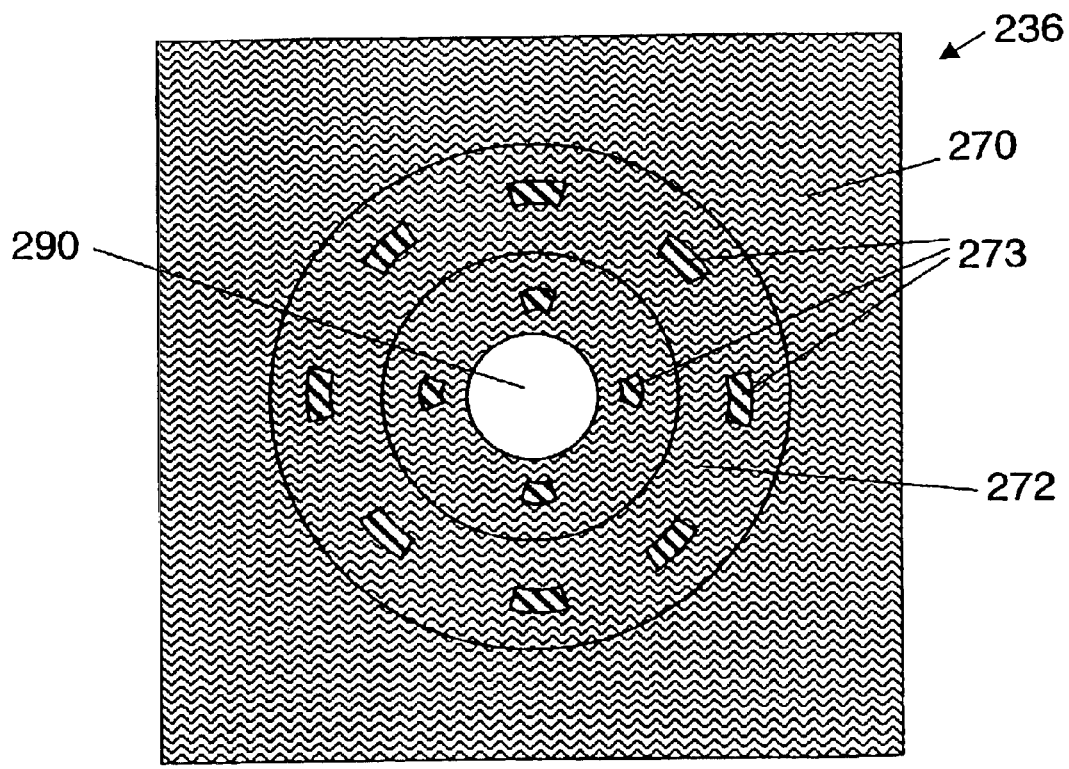
FIG. 4e is a top view of yet another embodiment of an optically pumped tunable organic VCSEL system, which uses a membrane structure.

FIG. 4e is a top view of yet another embodiment of an optically pumped tunable organic VCSEL system 236, which uses a membrane structure. The cross-section of the optically pumped tunable organic VCSEL system 236 is identical to that in FIG. 4a. The top mirror stack 290 is visible in the center of the structure, and is mechanically supported by a continuous support arm 272, which takes the form of a membrane. The continuous support arm 272 is formed by etching a plurality of release holes 273 through the support structure 270. To form the air gap 280 as shown in FIG. 4a, an etchant is allowed to penetrate the release holes 273 and remove a sacrificial material.

Figure 5:
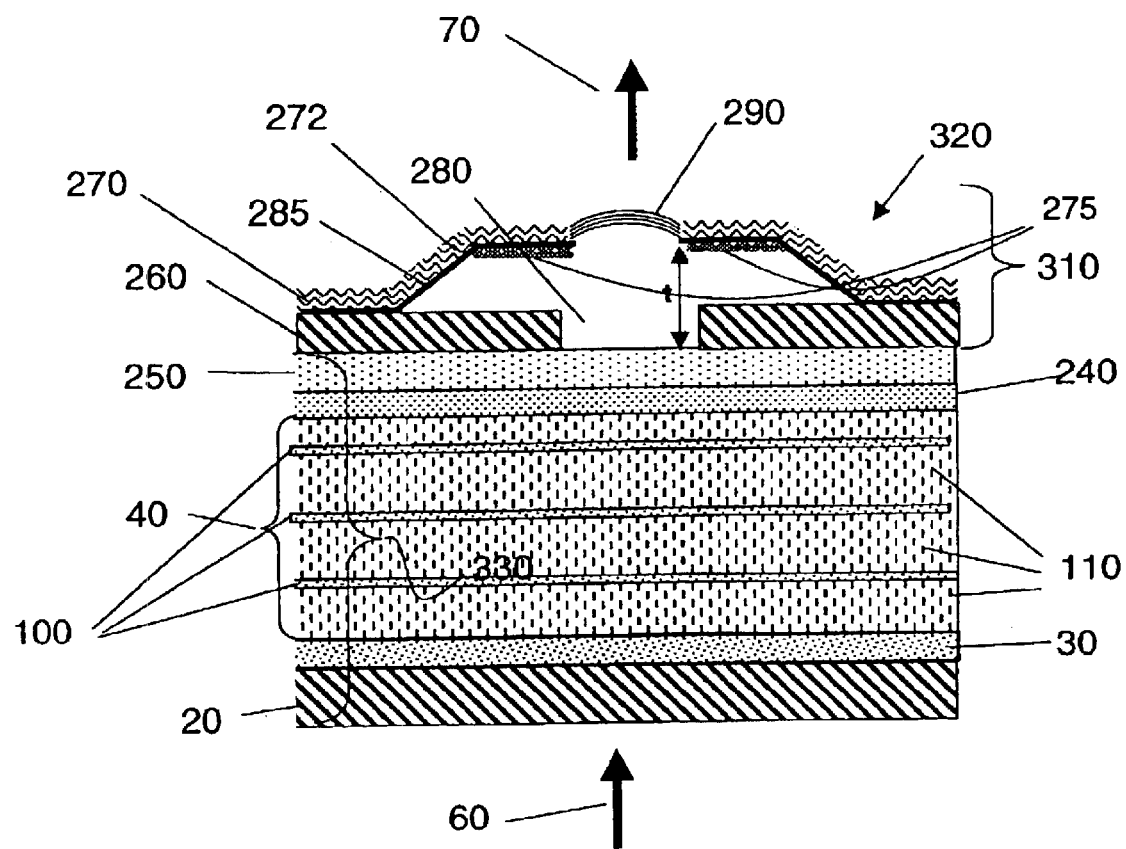
FIG. 5 is a cross-section side view of a different embodiment of an optically pumped tunable organic VCSEL system, employing a multi-layered film structure with a periodically structured organic gain region and with MEMs device for changing the optical path length of the laser cavity.

FIG. 5 is a cross-section side view of a different embodiment of an optically pumped tunable organic VCSEL system 320, employing a multi-layered film structure 330 with a periodically structured organic gain region and with MEMs device for changing the optical path length of the laser cavity. In this embodiment the micro-electromechanical mirror assembly 310 is the same as in FIG. 4a, but the multi-layered film structure 330 is altered. The multi-layered film structure 330 is based upon the vertical cavity organic laser device 80 depicted in FIG. 2. The multi-layered film structure 330 consists of the substrate 20, the bottom dielectric stack 30, the organic active region 40, and one or more index matching layers 240 and 250. In this case, the substrate 20 is transmissive for light of the pump beam 60. Pump beam 60 light is received by the multi-layered film structure 330 and produces spontaneous emission. The top dielectric stack 290 and the bottom dielectric stack 30 constitute the end mirrors of the organic laser cavity. The micro-electromechanical mirror assembly 310 consists of a bottom electrode 260, a support structure 270, support arms 272, a top electrode 275, an air gap 280, a mirror tether 285, and the top dielectric stack 290. Laser emission 70 occurs from the top dielectric stack 290. A voltage source (not shown) applied between the bottom electrode 260 and the top electrode 275 changes the thickness t, of the air gap 280 via electrostatic interaction and thereby varies the cavity length of the organic laser cavity device. This variation of the organic laser cavity length causes a wavelength variation of the optically pumped tunable organic VCSEL system 230. Although the top dielectric stack 290 is depicted as having a finite curvature, those skilled in the art would recognize that substantially flat top dielectric stacks 290 may also be used and should be considered another embodiment of the present invention. The organic active region 40 includes one or more periodic gain regions 100 and organic spacer layers 110 disposed on either side of the periodic gain regions 100 and arranged so that the periodic gain regions 100 are aligned with antinodes 103 of the device's standing wave electromagnetic field (see FIG. 2). This is illustrated in FIG. 2 where the laser's standing electromagnetic field pattern 120 in the organic active region 40 is schematically drawn. Since stimulated emission is highest at the antinodes 103 and negligible at nodes 105 of the electromagnetic field, it is inherently advantageous to form the active region 40 as shown in FIG. 2. The organic spacer layers 110 do not undergo stimulated or spontaneous emission and largely do not absorb either the laser emission 70 or the pump beam 60 wavelengths. It may be advantageous to use the structure depicted in FIG. 2 with periodic gain regions 100 defined in those applications where a single mode behavior is desired but with a limited tuning range. Without the weak confinement of the laser emissions to the device regions by modulating the reflectance of one of the mirrors as depicted in FIG. 3, it is difficult to obtain fundamental single lateral mode operation in a VCSEL. Thus, the curved top dielectric stack 290 would be advantageous in those applications where lateral mode control is important or where lateral confinement structures, as has been already described, are not employed. The cavity depicted in FIG. 5 is described as half-symmetric and is a member of a class of Fabry-Perot cavity structures. Output wavelengths for this cavity are governed by the mathematical relationship $$n\lambda/2 = L_{opt}$$

where n is an integer, λ is the wavelength, and $L_{opt}$ is the optical path length in the cavity. Variation of t, the thickness of the air gap 280, changes the optical path length. The top dielectric stack 290 may include one or more index matching layers; these are not shown in FIG. 5. These index matching layers (including index matching layers 240 and 250) minimize optical reflections at the air gap 280 interface with adjacent layers and improve the efficiency of the device. The bottom electrode 260 and the top electrode 275 are fabricated from conductive materials, typically metals, and in a ring geometry. Transparent conductive electrodes, such as indium-tin-oxide (ITO) or polymer materials could also be used. If the optical losses of such latter materials are low, a ring geometry may not be required. Support structure 270 is typically aluminum, titanium—tungsten (Ti—W), or silicon nitride ($SiN_x$) with sufficient thickness to provide mechanical support. Typical thicknesses are 2000 nm for the support structure 270 and 100–200 nm for the mirror tether 285. The mirror tether 285 is made from similar materials but much thinner in order to be flexible under the action of the electrostatic field provided by the tuning voltage source. It may be necessary to have an additional electrical isolation layer (not shown) between the bottom electrode 260 and the mirror tether 285. This layer is fabricated from insulating material. The support structure 270 defines at least one support arm 272, which mechanically stabilizes the top dielectric stack 290 at the required distance t. In order to accomplish this, the support structure 270 must have a suitably large intrinsic tensile stress. As discussed in relation to the optically pumped tunable organic VCSEL systems 230, 232, 234, and 236, the optically pumped tunable organic VCSEL system 320 can utilize a doubly supported beam structure, a cantilever structure, a multiple beam structure, or a membrane structure to mechanically stabilize the top dielectric stack at the desired position.

Figure 6:
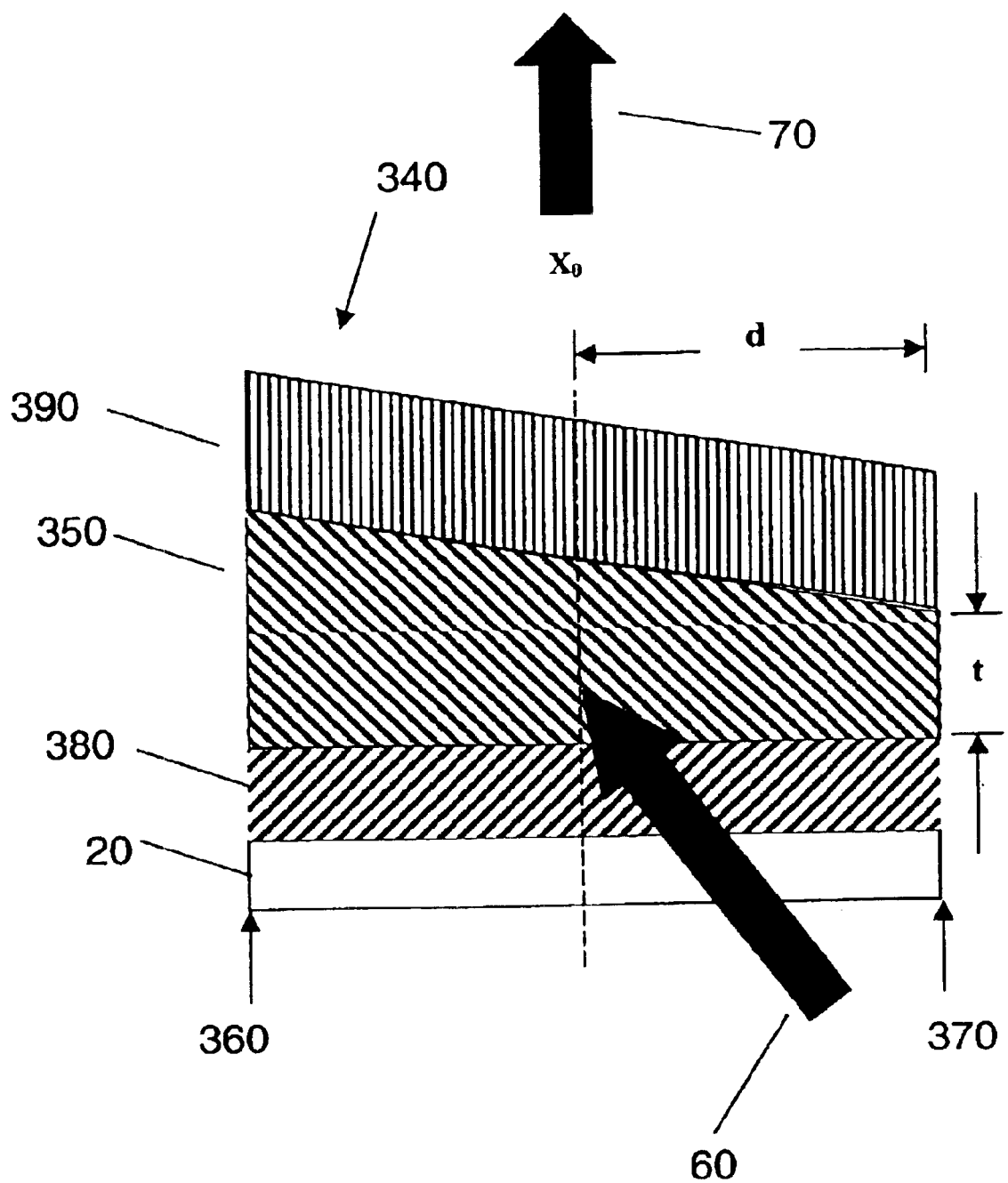
FIG. 6 is a cross-section side view of a prior art organic laser cavity device with a wedge-shaped organic active region.

FIG. 6 is a cross-section side view of a prior art tapered micro-cavity device 340 with a wedge organic active region 350. The thickness of the wedge organic active region 350, t, changes monotonically from the left edge 360 to the right edge 370. By changing the thickness of the laser cavity the tapered micro-cavity device 340 is tunable of a wide spectral region owing to the wide gain bandwidth of the emitting material in the wedge organic active region 350. The tapered micro-cavity device 340 is excited by pump beam 60 and produces laser emission 70. The pump beam 60 excites the tapered micro-cavity device 340 at point $X_0$ that is located at a distance d away from the right edge 370. The bottom mirror 380 and the top mirror 390 along with the wedge organic active region 350 define the laser cavity. The mirrors 380 and 390 may be in the form of metal films or dielectric stacks. The wavelength of the laser emission 70 is a function of the thickness t and the refractive index of the material in the wedge organic active region 350. By changing the position of the point $X_0$ a different section of the tapered micro-cavity device 340 is excited by the pump beam 60 resulting in a different laser emission 70 wavelength. Changing the position of $X_0$ by varying d is accomplished by moving the tapered micro-cavity device 340 relative to the pump beam 60.

Figure 7:
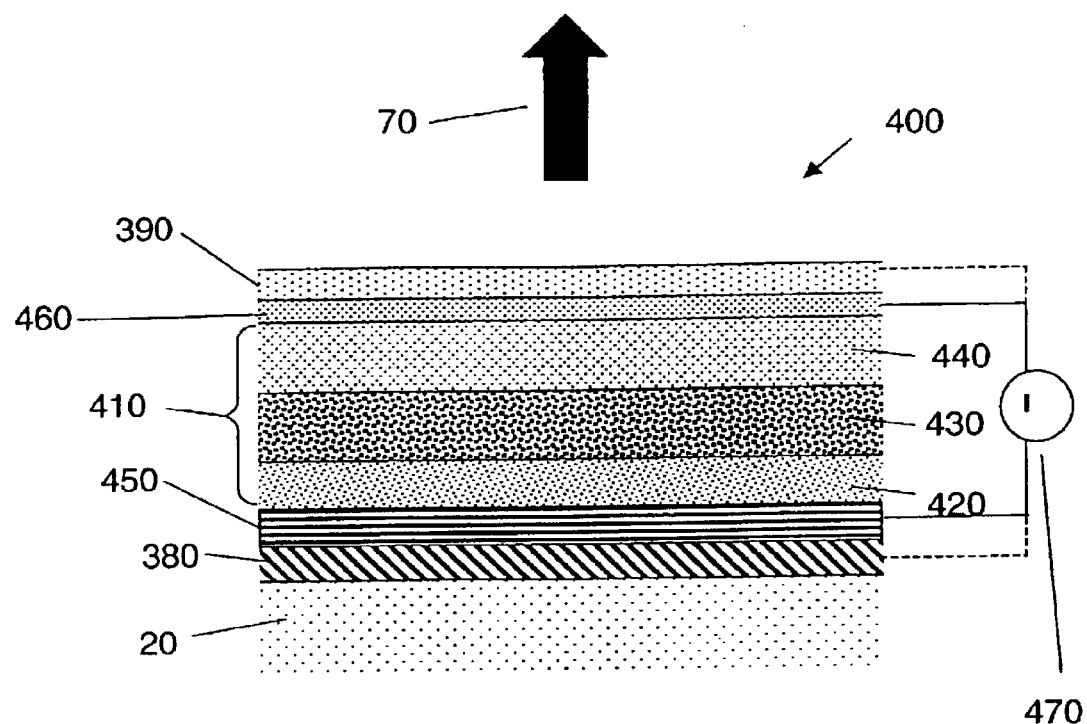
FIG. 7 is a cross-section side view of a prior art electrically pumped organic vertical cavity laser.

FIG. 7 is a cross-section side view of a prior art electrically pumped organic vertical cavity laser 400. A bottom mirror 380, a top mirror 390, and an organic active region 410 are disposed on a transparent substrate 20. In this embodiment, the organic active region 410 is comprised of sublayers and is electroluminescent so as to produce laser light when electrical current is passed through the organic active region 410. As is known in the art, the organic active region 410 sublayers consist of a hole transport layer 420, an emissive layer 430, and an electron transport layer 440. It may be necessary to include electrodes 450 and 460 in the electrically pumped organic vertical cavity laser 400, when the bottom and top mirrors 380 and 390, respectively, are fabricated from non-electrically conducting materials. In this case the electrode 450 and electrode 460 are to be substantially transparent to the light emitted by the emissive layer 430, and preferably comprise indium-tin-oxide (ITO) or other electrically conducting material. The current source 470 is applied to either the top mirror 390 and bottom mirror 380 if these layers are electrically conducting, or to the electrodes 450 and 460. It is to be understood that any combination of mirror type and electrode arrangements are considered embodiments of the present invention. By suitable design of the top mirror 390 the laser emission 70 exits electrically pumped organic vertical cavity laser 400 through the top mirror 390. This is accomplished by fabricating the top mirror 390 to have slightly lower reflectivity than the bottom mirror 380.

Figure 8:
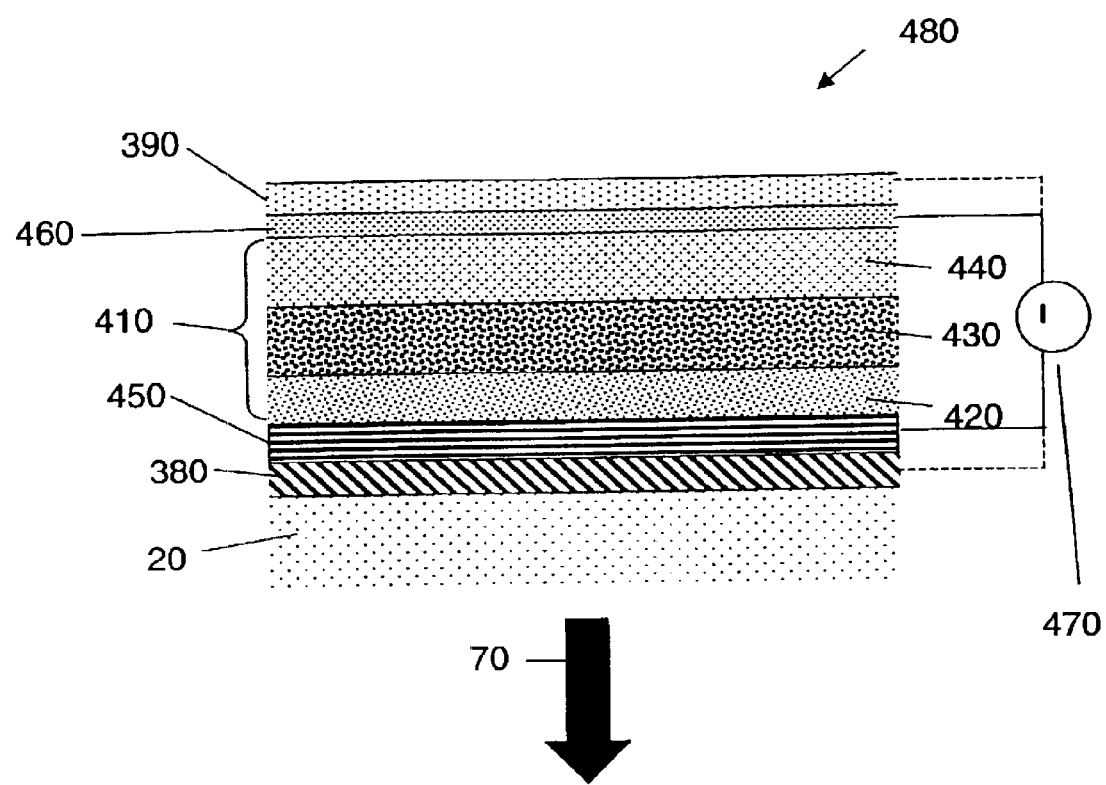
FIG. 8 is a cross-section side view of a different embodiment of a prior art electrically pumped organic vertical cavity laser.

FIG. 8 is a cross-section side view of a different embodiment of a prior art electrically pumped organic vertical cavity laser 480. A bottom mirror 380, a top mirror 390, and an organic active region 410 are disposed on a transparent substrate 20. In this embodiment, the organic active region 410 is comprised of sublayers and is electroluminescent so as to produce laser light when electrical current is passed through the organic active region 410. The mechanism of electrical excitation of such a device is called electrical injection. As is known in the art, the organic active region 410 sublayers consist of a hole transport layer 420, an emissive layer 430, and an electron transport layer 440. It may be necessary to include electrodes 450 and 460 in the electrically pumped organic vertical cavity laser 400, when the bottom and top mirrors 380 and 390, respectively, are fabricated from non-electrically conducting materials. In this case, the electrode 450 and electrode 460 are to be substantially transparent to the light emitted by the emissive layer 430, and preferably comprise indium-tin-oxide (ITO) or other electrically conducting material. The current source 470 is applied to either the top mirror 390 and bottom mirror 380 if these layers are electrically conducting, or to the electrodes 450 and 460. It is to be understood that any combination of mirror type and electrode arrangements are considered embodiments of the present invention. By suitable design of the top mirror 390 the laser emission 70 exits electrically pumped organic vertical cavity laser 400 through the bottom mirror 380. This is accomplished by fabricating the top mirror 390 to have slightly higher reflectivity than the bottom mirror 380.

Figure 9:
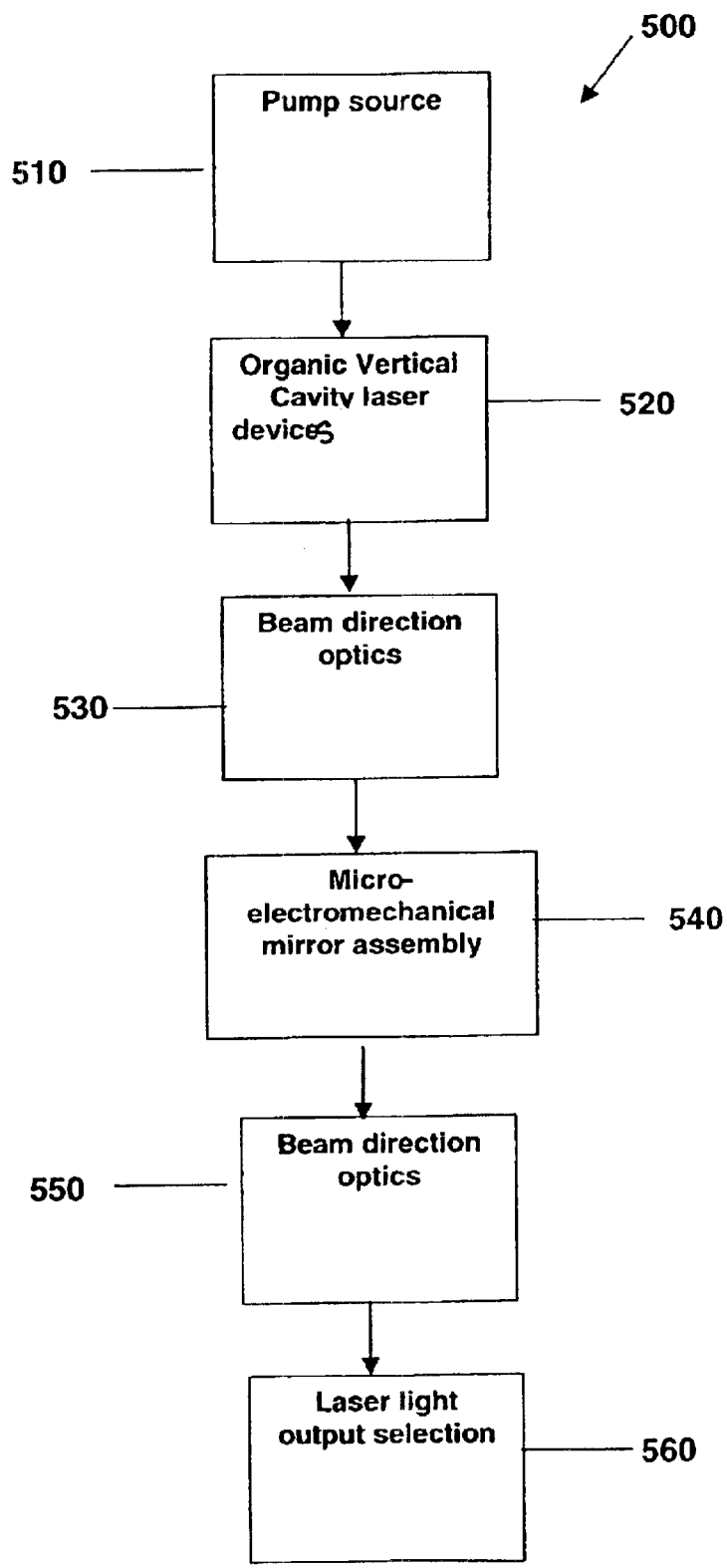
FIG. 9 is a block diagram that describes the operation of yet another embodiment of an tunable organic VCSEL system.

FIG. 9 is a block diagram 500 that describes the operation of yet another embodiment of a tunable organic VCSEL system. The figure describes yet another system for mechanically tuning optical wavelengths emitted from an organic laser cavity device. A pump source described in block 510, excites a plurality of organic vertical cavity laser devices, as depicted in block 520. Numerous types of organic cavity laser devices are depicted by block 520 and shown explicitly in FIGS. 1–8 and FIGS. 12–18 (as individual devices or groups of devices, and labeled herein as 10, 80, 190, 230, 320, 340, 400, 480, 702, 1000, and 1050). The organic vertical cavity laser device structure is designed so that the individual organic vertical cavity laser devices produce laser light at substantially different optical wavelengths. The pump source in block 510 may be either a photon source or an electrical source for excitation. Block 530 shows beam direction optics used to direct the optical laser output of the organic vertical cavity laser device structure onto a micro-electromechanical mirror assembly, shown in block 540. The optics include commonly used lenses or mirrors as is well known to those skilled in the art.

The micro-electromechanical mirror assembly block 540 may be adjusted to direct the optical laser light to additional beam direction optics depicted in block 550. The optics include commonly used lenses or mirrors as is well known to those skilled in the art. Block 560 describes the laser light output selection. In this block a band of optical wavelengths from one of the plurality of organic vertical cavity lasers is selected and leaves the device at the system output.

Figure 10:
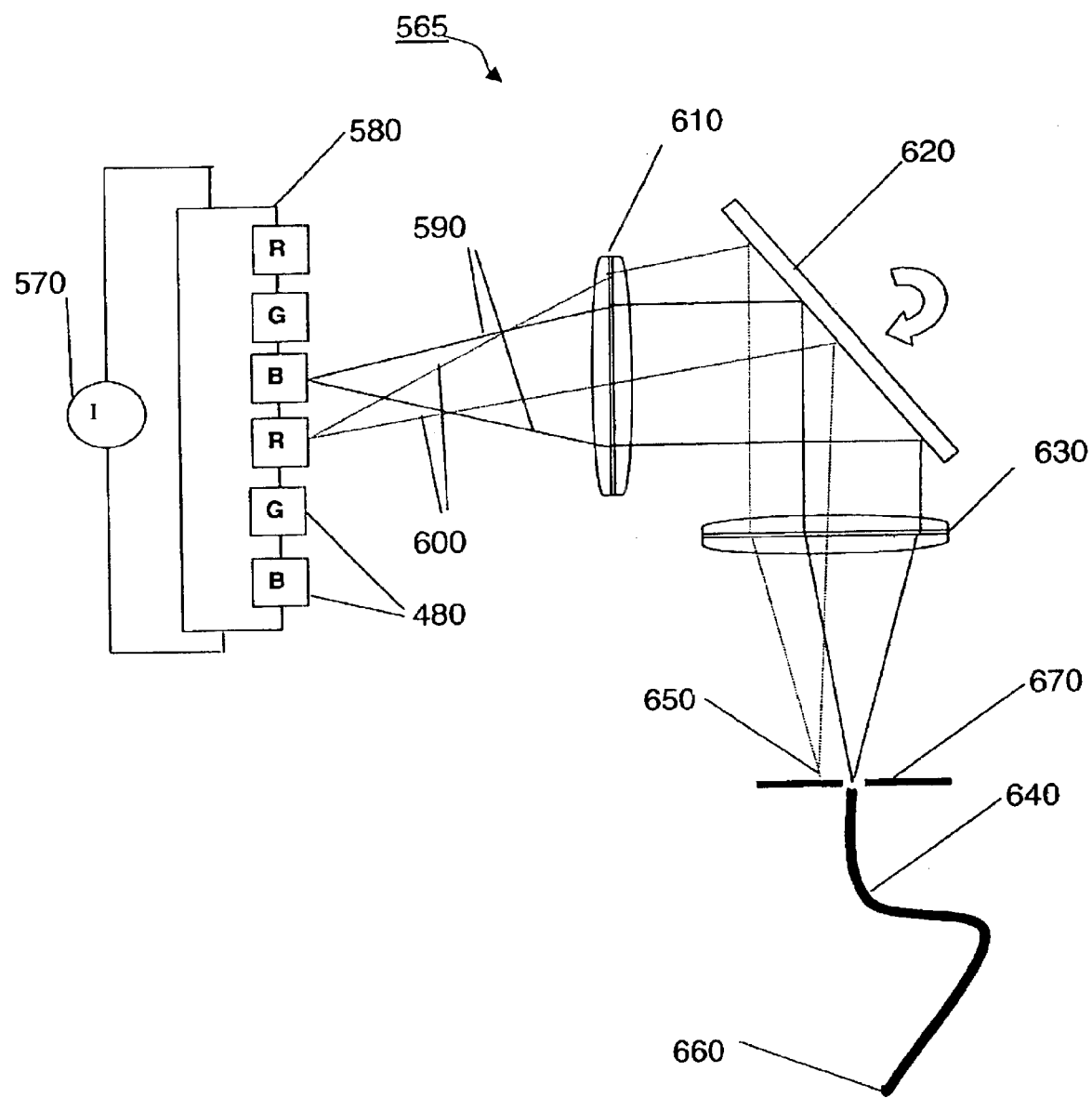
FIG. 10 is a schematic diagram of a tunable organic VCSEL system with MEMs device for selection of the output wavelength of an organic laser cavity device employing an electrically pumped organic vertical cavity laser.

FIG. 10 is a schematic diagram of a tunable organic VCSEL system 565 with MEMs device for selection of the output wavelength of an organic laser cavity device employing an electrically pumped organic vertical cavity laser. A current source 570 provides a means of excitation for an organic vertical cavity laser device structure 580 and produces a plurality of optical wavelengths. The organic vertical cavity laser device structure 580 is an array of fixed wavelength organic laser cavity devices. In this embodiment, the organic vertical cavity laser device structure 580 consists of electrically pumped organic vertical cavity lasers 480 wherein each electrically pumped organic vertical cavity laser 480 is fabricated to produce substantially different wavelength laser light. Selecting the laser light emitted by each device produces a method for tuning the output of the tunable organic VCSEL system 565 in a stepwise fashion. The step size (or wavelength interval) is determined by the difference in the wavelengths between any two electrically pumped organic vertical cavity lasers 480. The light emitted by a particular electrically pumped organic vertical cavity laser 480 is selected by the action of the mirror assembly 620. A single embodiment uses a micro-electromechanical mirror for the mirror assembly 620. In the embodiment shown in FIG. 10, the changing of the tilt angle of the mirror assembly 620 selects the laser light emission from a particular electrically pumped organic vertical cavity laser 480. The selected optical rays 590 pass through the system to the output selection fiber 640. The non-selected optical rays 600 pass through the tunable organic VCSEL system 565 to the non-selected output 650. An aperture 670 or other beam-blocking device preludes the non-selected optical rays 600 from leaving the tunable organic VCSEL system 565. Beam direction optics 610 direct the emitted laser light to the mirror assembly 620. Additional beam direction optics 630 direct the light from the mirror assembly 620 to the output selection fiber 640. Commonly employed optical elements such as mirrors and lenses are employed in beam direction optics 610 and 630. In some circumstances the use of micro-optics to produce small, lightweight systems may be desirable. Laser light is transmitted by the output selection fiber 640 to the system output 660. Although an optical fiber is used as the output selection device in this embodiment, it is to be understood that other commonly used means for selecting or filtering optical wavelengths such as mirrors, apertures, filters, etc. can be employed in this manner.

Figure 11:
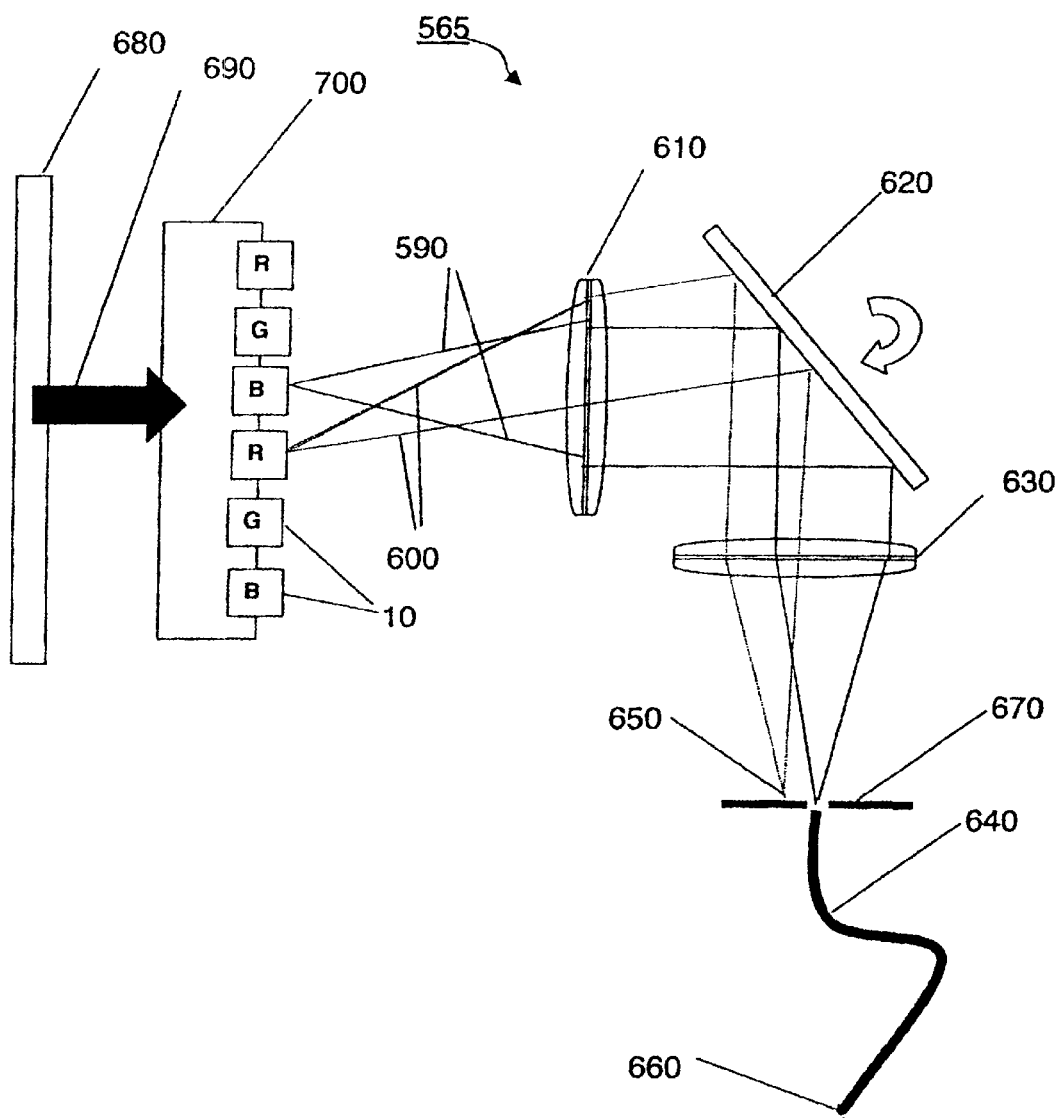
FIG. 11 is a schematic diagram of a tunable organic VCSEL system with MEMs device for selection of the output wavelength of an organic laser cavity device employing an optically pumped organic vertical cavity laser.

FIG. 11 is a schematic diagram of an alternate embodiment of a tunable organic VCSEL system 565 with MEMs device for of selection the output wavelength of an organic laser cavity device employing an optically pumped organic vertical cavity laser. A photon source 680 produces pump beam light 690 and provides a means of excitation for an organic vertical cavity laser device structure 700 and produces a plurality of optical wavelengths. The photon source 680 may be a light emitting diode (LED), a laser, or any other incoherent light source. The organic vertical cavity laser device structure 700 is an array of fixed wavelength organic laser cavity devices. In this embodiment, the organic vertical cavity laser device structure 700 consists of optically pumped vertical cavity organic laser devices 10 wherein each optically pumped vertical cavity organic laser device 10 is fabricated to produce substantially different wavelength laser light. Alternatively, other optically pumped laser devices may be used in this embodiment, for example, the tapered micro-cavity device 340 (shown in FIG. 6) can be used to produce a plurality of optical wavelengths. In this instance it is appropriate to use a laser as the photon source 680 for excitation. Substantially identical, tapered micro-cavity devices 340 could be made to produce substantially different wavelength laser light by varying the position and angle of the pump beam 690 light as previously described. Selecting the laser light emitted by each device produces a method for tuning the output of the tunable organic VCSEL system 565 in a stepwise fashion. The step size (or wavelength interval) is determined by the difference in the wavelengths between any two vertical cavity organic laser devices 10. The light emitted by a particular vertical cavity organic laser device 10 is selected by the action of the mirror assembly 620. One embodiment uses a micro-electromechanical mirror for the mirror assembly 620. In the embodiment shown in FIG. 11, the changing of the tilt angle of the mirror assembly 620 selects the laser light emission from a particular vertical cavity organic laser device 10. The selected optical rays 590 pass through the tunable organic VCSEL system 565 to the output selection fiber 640. The non-selected optical rays 600 pass through the tunable organic VCSEL system 565 to the non-selected output 650. An aperture 670 or other beam-blocking device preludes the non-selected rays from leaving the tunable organic VCSEL system 565. Beam direction optics 610 direct the emitted laser light to the mirror assembly 620. Additional beam direction optics 630 direct the light from the mirror assembly 620 to the output selection fiber 640. Commonly employed optical elements such as mirrors and lenses are employed in beam direction optics 610 and 630. In some circumstances the use of micro-optics to produce small, lightweight systems may be desirable. Laser light is transmitted by the output selection fiber 640 to the system output 660. Although an optical fiber is used as the output selection device in this embodiment, it is to be understood that other commonly used means for selecting or filtering optical wavelengths such as mirrors, apertures, filters, etc. can be employed in this manner.

Figure 12:
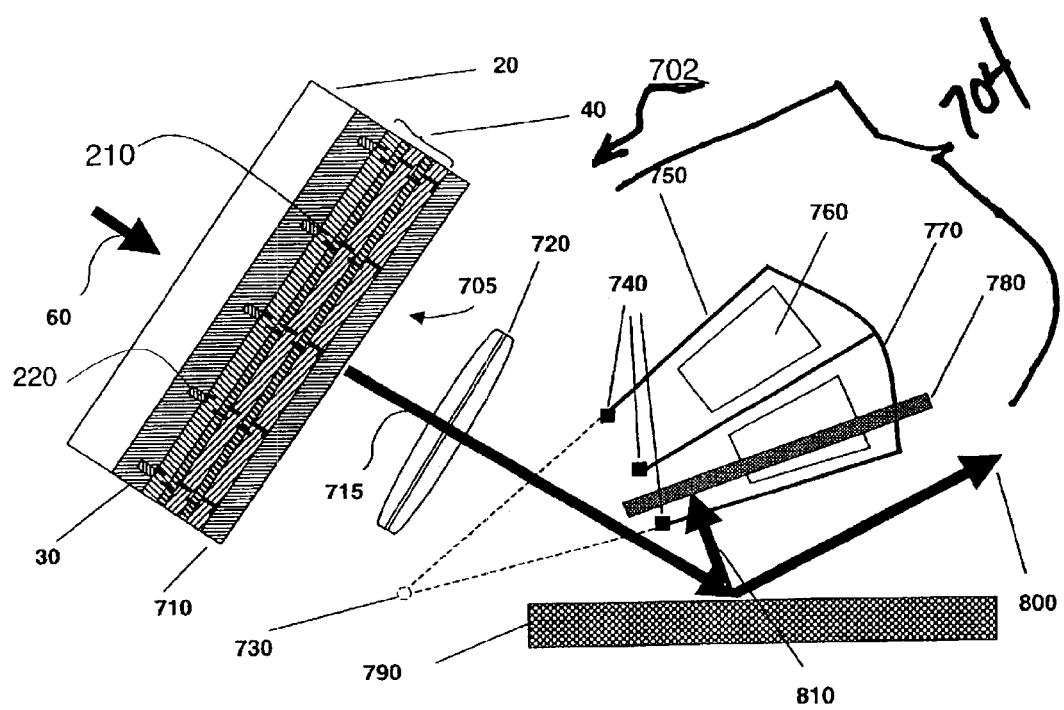
FIG. 12 is a cross-section side view of a different embodiment of an optically pumped tunable organic VCSEL system, employing an optically pumped multi-layered film structure with a periodically structured organic gain region and with two-dimensional phase-locking and additionally, with MEMs device for changing the angle of a mirror used in conjunction with a grating for tuning the laser cavity.

FIG. 12 is a cross-section side view of a different embodiment of an optically pumped tunable organic VCSEL system 702, employing an optically pumped multi-layered film structure with a periodically structured organic gain region and with two-dimensional phase-locking in combination with a grating assembly 704. In one embodiment, a MEMs device is used in the grating assembly 704 for changing the angle of a mirror in conjunction with a grating for tuning the laser cavity. In this embodiment, the grating assembly consists of elements 730, 740, 750, 760, 770, 780, and 790. In FIG. 12, a pump beam 60 excites an optically pumped multi-layered film structure 705. This optically pumped multi-layered film structure 705 is similar to the multi-layered film structure 45 (see FIG. 1) and comprises a support 20, a bottom dielectric stack 30, an organic active region 40, and additionally, an index matching layer or layers 710. In the embodiment shown in FIG. 12, the organic active region is of the type containing etched regions 220 and inter-pixel regions 210, producing a phase-locked organic laser array 190 (see FIG. 3), but it is to be understood that other arrangements of the organic active region 40 similar to those described above are also possible. An index matching layer or layers 710 is deposited as part of the optically pumped multi-layered film structure 705. The index matching layer or layers 710 serve to encapsulate the organic active region and preclude harmful exposure to air and moisture, and as well, improve the optical efficiency of the device by reducing reflections at the air interface. Light output 715 from the optically pumped multi-layered film structure 705 is directed by optics 720 to the surface of a diffraction grating 790. In one embodiment, optics 720 consist of a microlens. The diffraction grating 790 is a reflection-type grating. The structure comprised of the suspension beams 750, the rotary comb drive 760, the rotary motor frame 770, and the movable mirror 780, provides the tuning mechanism for this embodiment of the tunable organic VCSEL system. Elements 750, 760, and 770 comprise a MEMs electrostatic rotary actuator and vary the angle of the movable mirror 780. The suspension beams 750 are attached to a support (not shown) at the substrate attachment points 740. The motion of the entire MEMs electrostatic rotary actuator is to produce a rotation of the movable mirror 780 about a pivot point 730. A voltage source (not shown) causes the rotary motion when the electrical potential is applied to rotary comb drive 760 elements. The embodiment shows an arrangement of optical components known as a Littman-Metcalf laser cavity. The MEMs rotary actuator is designed to rotate the movable mirror 780 about a pivot point 730 located in a position that maintains the same number of optical half-wavelengths in the cavity at all wavelengths. The diffracted beam 810 reflects from the movable mirror 780 and provides optical feedback for the laser cavity. This design is desirable because the laser output beam 800 occurs at a fixed angle regardless of the selected wavelength. Also this design provides mode-hop-free (smooth) tuning of the wavelength of the tunable organic VCSEL system.

Figure 13:
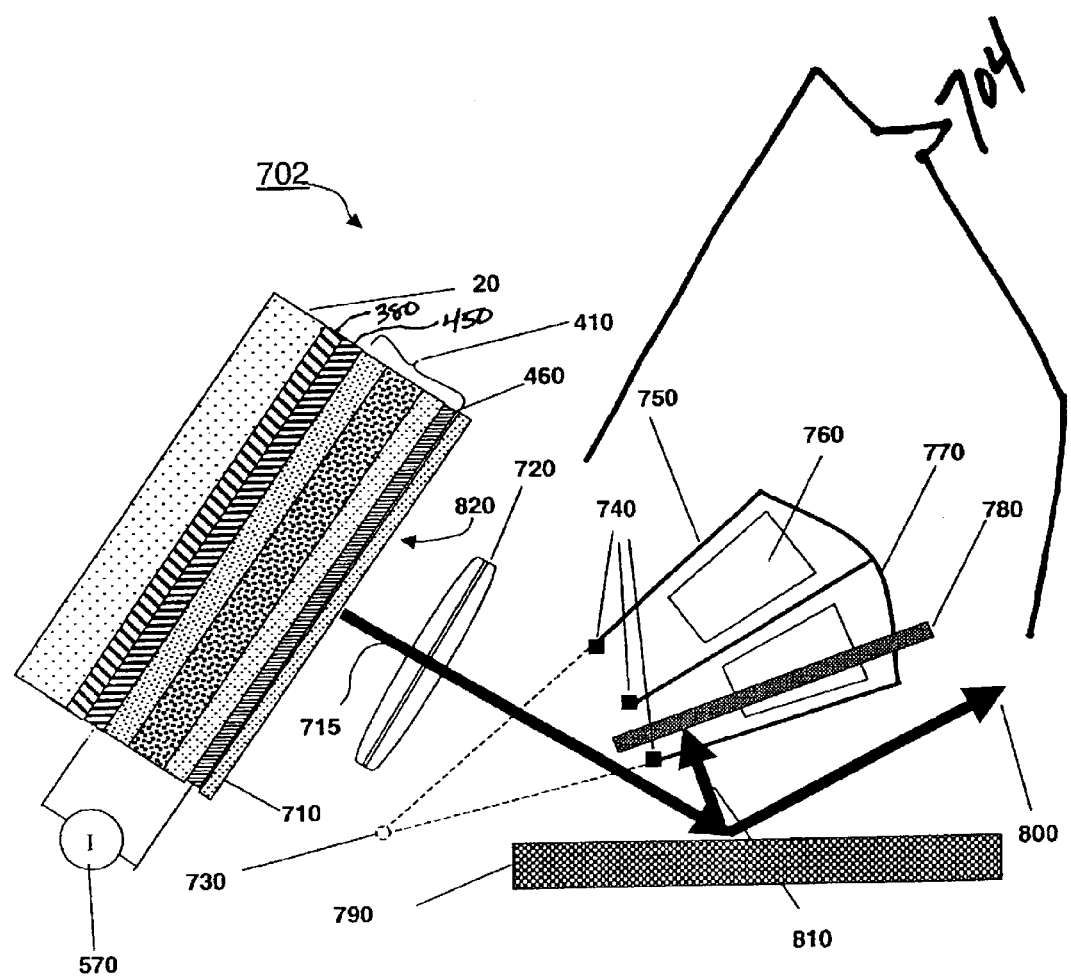
FIG. 13 is a cross-section side view of a different embodiment of an optically pumped tunable organic VCSEL system, employing an electrically pumped multi-layered film structure and additionally, with MEMs device for changing the angle of a mirror used in conjunction with a grating for tuning the laser cavity.

FIG. 13 is a cross-section side view of a different embodiment of a tunable organic VCSEL system 702, employing an electrically pumped multi-layered film structure with a periodically structured organic gain region and with two-dimensional phase-locking in combination with a grating assembly 704. In the preferred embodiment, a MEMs device is used in the grating assembly 704 for changing the angle of a mirror in conjunction with a grating for tuning the laser cavity. In this embodiment, the grating assembly consists of elements 730, 740, 750, 760, 770, 780, and 790. In FIG. 13, a current source 570 excites an electrically pumped multi-layered film structure 820. This electrically pumped multi-layered film structure 820 comprises a support 20, a bottom mirror 380, an organic active region 410, electrodes 450 and 460, and additionally, an index matching layer or layers 710. The electrically pumped multi-layered film structure 820 is similar to the electrically pumped organic vertical cavity laser 400 (see FIG. 7), but does not contain the top mirror 390 as part of the structure. An index matching layer or layers 710 is deposited as part of the electrically pumped multi-layered film structure 820. The index matching layer or layers 710 serve to encapsulate the organic active region and preclude harmful exposure to air and moisture, and as well, improve the optical efficiency of the device by reducing reflections at the air interface. Light output 715 from the electrically pumped multi-layered film structure 820 is directed by optics 720 to the surface of a diffraction grating 790. In the preferred embodiment, optics 720 consist of a microlens. The diffraction grating 790 is a reflection-type grating. The structure comprised of the suspension beams 750, the rotary comb drive 760, the rotary motor frame 770, and the movable mirror 780, provides the tuning mechanism for this embodiment of the tunable organic VCSEL system.

Suspension beams 750, rotary comb drive 760, and rotary motor frame 770 comprise a MEMs electrostatic rotary actuator and vary the angle of the movable mirror 780. The suspension beams 750 are attached to a support (not shown) at the substrate attachment points 740. The motion of the entire MEMs electrostatic rotary actuator is to produce a rotation of the movable mirror about a pivot point 730. A voltage source (not shown) causes the rotary motion when the electrical potential is applied to rotary comb drive 760 elements. The embodiment shows an arrangement of optical components known as a Littman-Metcalf laser cavity. The MEMs rotary actuator is designed to rotate the movable mirror 780 about a pivot point 730 located in a position that maintains the same number of optical half-wavelengths in the cavity at all wavelengths. The diffracted beam 810 reflects from the movable mirror 780 and provides optical feedback for the laser cavity. This design is desirable because the laser output beam 800 occurs at a fixed angle regardless of the selected wavelength. Also, this design provides mode-hop-free (smooth) tuning of the wavelength of the tunable organic VCSEL system.

Figure 14:
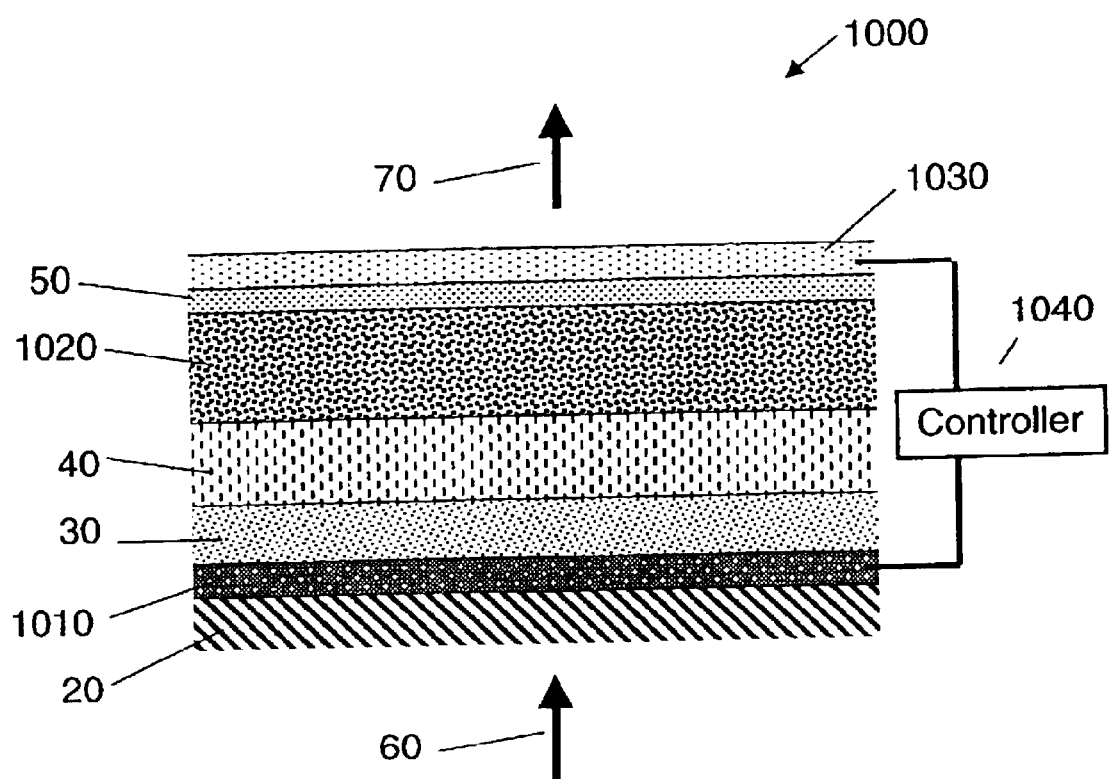
FIG. 14 is a cross-section side view of a tunable organic VCSEL system wherein alternate means for changing the optical path length are described.

FIG. 14 is a cross-sectional view of yet another embodiment of a tunable organic VCSEL system 1000, which uses a material with a controllable refractive index to tune the laser wavelength. The tunable organic VCSEL system 1000 comprises a substrate 20. A pump beam 60 is provided below and passes through the substrate 20. A lower electrode 1010 is provided above the substrate 20, and must be transparent to the pump beam 60. The lower electrode 1010 can be, for example, ITO. Alternatively, an opaque lower electrode can be used in a configuration in which the pump beam 60 is provided from the top.

The bottom dielectric stack 30 and the organic active region 40 are respectively provided above the lower electrode 1010. The top dielectric stack 50 is provided above the organic active region 40, thereby defining the laser cavity. Between the bottom dielectric stack 30 and the top dielectric stack 50, a dielectric control layer 1020 is provided that is used to control the optical cavity length of the laser cavity. Because the laser wavelength is proportional to the optical cavity length, the laser wavelength is thereby tunable. A top electrode 1030 is provided above the top dielectric stack 50. A controller 1040 is provided to control the index of refraction of the dielectric control layer 1020.

In one embodiment, the dielectric control layer 1020 comprises a material with a variable index of refraction that is controlled by applying an electric field. Candidate materials are electro-optic materials, such as lithium niobate, or liquid crystal layers. The dielectric control layer 1020 has an index of refraction that varies with the applied electric field as $$n(E) = n_o + \frac{1}{2}n_o^3 rE$$

where E is the applied electric field, no is the refractive index in the absence of the applied field, and r is the electro-optic coefficient. The controller 1040 for this embodiment is a voltage source applied between the top electrode 1030 and the lower electrode 1010.

In a second embodiment, the dielectric control layer 1020 comprises a photorefractive material. Lithium niobate doped with $Fe^{+3}$ is a candidate material. In this case, the controller 1040 is an optical source, such as a UV lamp, and the refractive index changes in response to the intensity. As a third embodiment, the dielectric control layer 1020 comprises a material that is thermally sensitive, and the controller 1040 is a thermal source, such as a resistive heating element. The dielectric control layer can then modify the laser wavelength via thermal expansion and/or by thermally induced changes to the refractive index, i.e.

$$L_{opt}(\Delta T) = L_{opt,0} + n_{dc,o}\frac{\partial L_{dc}}{\partial T} + L_{dc,o}\frac{\partial n_{dc}}{\partial T},$$

where $\Delta T$ is the variation of the temperature from a steady-state temperature, $L_{opt,o}$ is the optical cavity length at the steady-state temperature, $n_{dc}$ is the refractive index of the dielectric control layer, and $L_{dc}$ is the physical thickness of the dielectric control layer.

Figure 15:
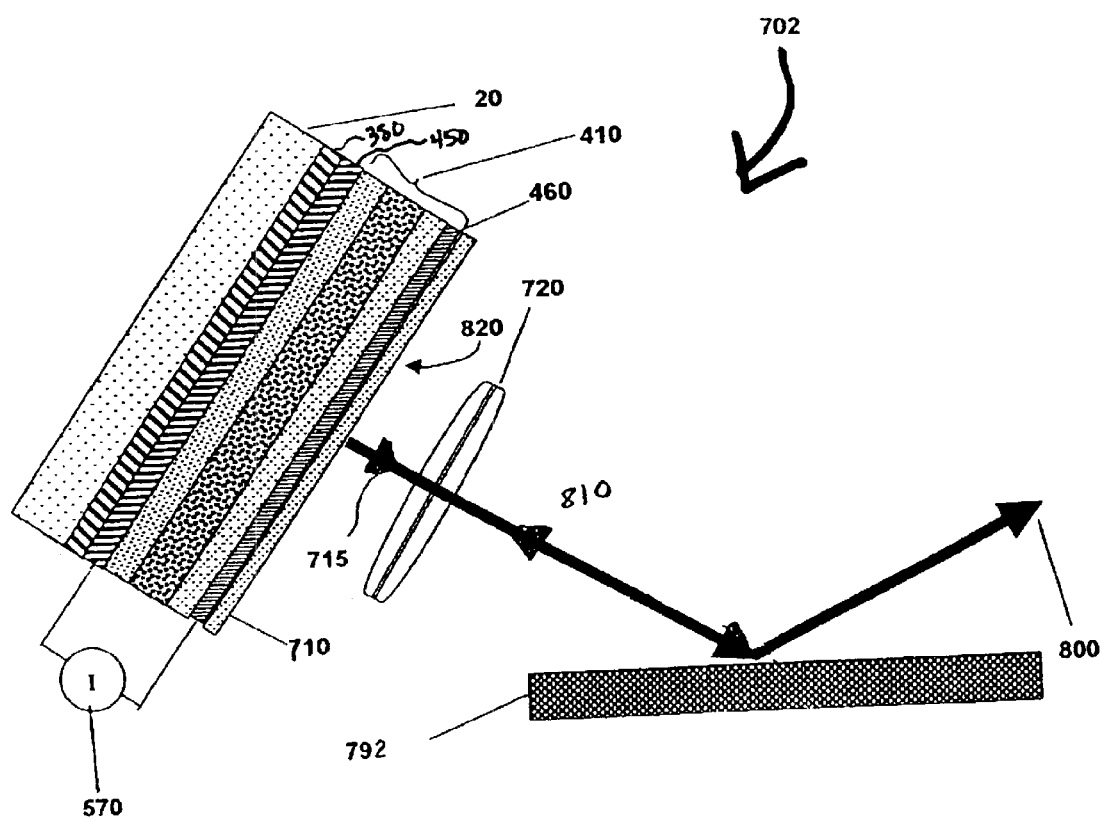
FIG. 15 is a cross-section side view of a different embodiment of tunable organic VCSEL system.

FIG. 15 is a cross-section side view of a different embodiment of tunable organic VCSEL system, employing an alternative grating assembly 704, that is, an electrically tunable grating 792 in the Littrow configuration. The Littrow configuration, as is well known in the art, features the use of a grating in a condition such that light is diffracted so as to be directed back in the direction from which it came. Thus, light output 715 emergent from electrically pumped multi-layered film structure 820, is partially returned as diffracted beam 810. By changing the period of electrically tunable grating 792, the Littrow wavelength is changed and thus the lasing wavelength can be tuned. A voltage source (not shown) causes the period of electrically tunable grating 792 to change. Output coupling is again achieved via the zeroeth order beam from the electrically tunable grating 792. In FIG. 15, a current source 570 excites an electrically pumped multi-layered film structure 820. This electrically pumped multi-layered film structure 820 comprises a support 20, a bottom mirror 380, an organic active region 410, electrodes 450 and 460, and additionally, an index matching layer or layers 710. The electrically pumped multi-layered film structure 820 is similar to the electrically pumped organic vertical cavity laser 400, (shown in FIG. 7) but does not contain the top mirror 390 as part of the structure. An index matching layer or layers 710 is deposited as part of the electrically pumped multi-layered film structure 820. The index matching layer or layers 710 serve to encapsulate the organic active region and preclude harmful exposure to air and moisture, and as well, improve the optical efficiency of the device by reducing reflections at the air interface. Light output 715 from the multi-layered film structure 820 is directed by optics 720 to the surface of a diffraction grating 792. In one embodiment, optics 720 consists of a microlens. The diffraction grating 792 is a reflection-type grating having a tunable grating period. Such structures are known in the art, for example, electrostatically tunable MEMS gratings or analog tunable gratings comprising piezoelectric actuators (see, for example, DARPA Quarterly Report F30602-97-2-0106).

Figure 16A:
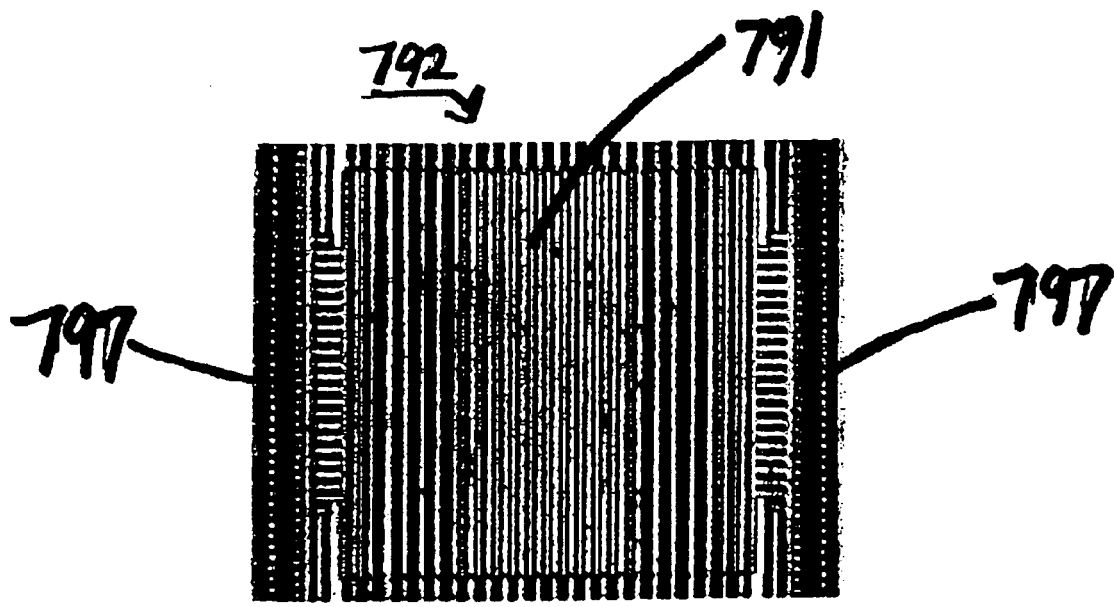
FIG. 16a depicts a prior art electrostatically tunable MEMS gratings or analog tunable gratings comprising piezoelectric actuators.
Figure 16B:
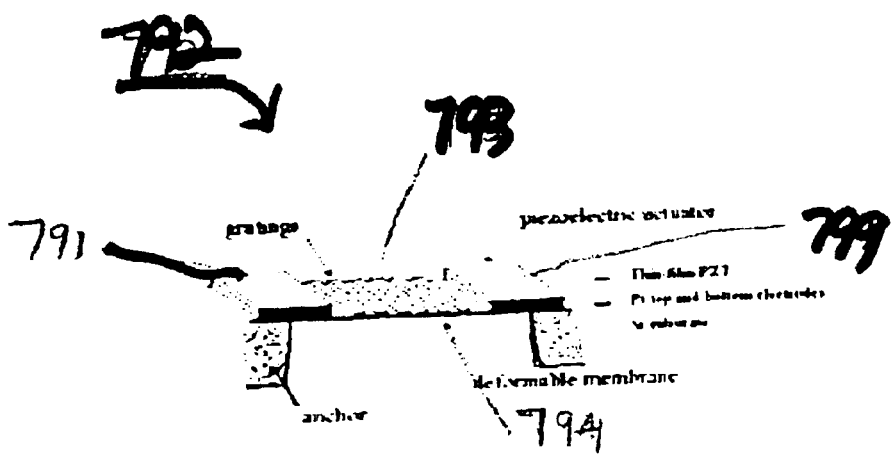
FIG. 16b depicts an alternate prior art electrostatically tunable MEMS gratings or analog tunable gratings comprising piezoelectric actuators.

FIGS. 16a and 16b depict prior art electrostatically tunable MEMS gratings or analog tunable gratings comprising piezoelectric actuators, respectively. In FIG. 16a, a flexible grating structure 791, is comprised of suspended beams supported by flexures and is actuated by opposing electrostatic comb-drive linear motors 797. Actuation of the comb-drive motors 797 simply changes the period of electrically tunable grating 792. In FIG. 16b, membrane grating 793 comprises periodic structures forming the grating, the structures being located on a deformable membrane 794. Piezoelectric actuators 799 deform the membrane and effect a change in grating period.

Referring back to FIG. 15, the diffracted beam 810 diffracts from the electrically tunable grating 792 and provides optical feedback for the laser cavity. This design is desirable because the laser output beam 800 occurs at a fixed angle regardless of the selected wavelength. Also this design provides mode-hop-free (smooth) tuning of the wavelength of the tunable organic VCSEL system. Grating 792 can be designed to have an optimal output coupling efficiency by appropriate choice of input angle and the use of blazed facets for electrically tunable grating 792. A tunable organic VCSEL could also be achieved using the electrically tunable grating in the Littrow geometry and an optically pumped multi-layered film structure.

Figure 17:
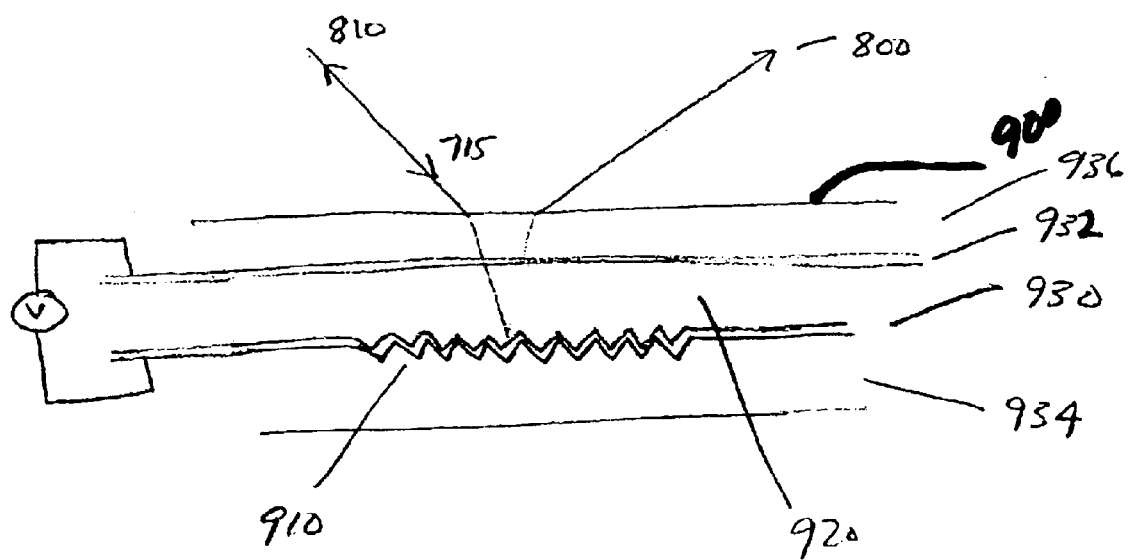
FIG. 17 depicts an alternative embodiment of an electrically tunable diffraction grating.

In FIG. 17, an alternative embodiment of an electrically tunable grating 792 is shown. Electro-optic grating 900 is formed from a fixed grating 910 having a periodic surface structure. In contact with fixed grating 910, is an electro-optic layer 920, preferably a liquid crystalline layer. Electro-optic layer 920 is surrounded above and below by conductive layers 930 and 932, respectively supported by substrates 934 and 936. For the case where electro-optic layer 920 is liquid crystalline layer, an appropriate means to maintain the space between conductive layers 930 and 932 is employed, as is well known. Conductor 932 is a transparent conductor, for example, indium-yin-oxide (ITO). Conductor 930 could be a reflective metal or a transparent conductor. Preferred reflective metals include aluminum, silver, and gold. The application of a voltage across the electro-optic layer causes a change in the refractive index of electro-optic layer 920 that results in a change in the diffractive behavior of electro-optic grating 900. When conductive layer 932 is a transparent conductor, light from the electrically pumped multi-layered film structure 820 in FIG. 15 may be incident on the fixed grating 910 through substrate 934. This embodiment of an electrically tunable grating may be employed in the Littrow configuration to form a tunable organic VCSEL.

Figure 18:
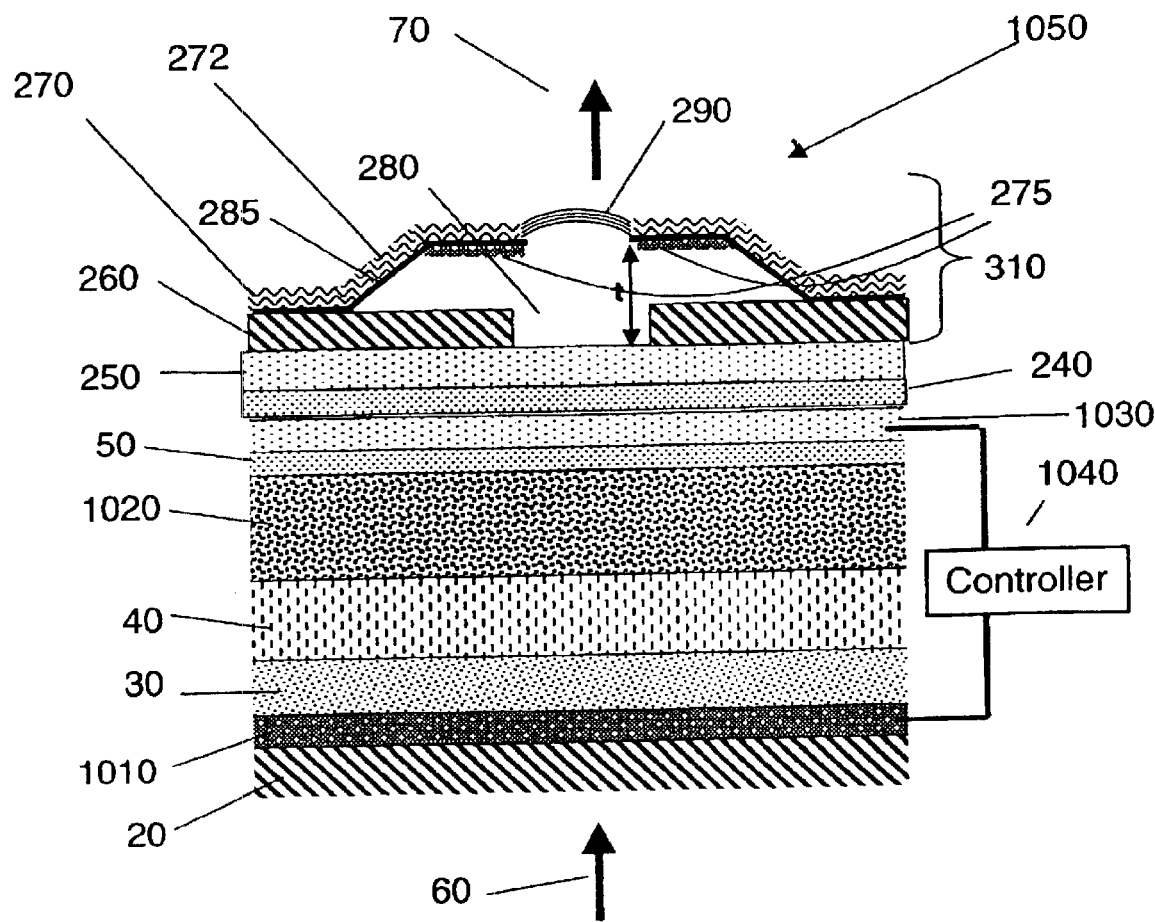
FIG. 18 is a cross-section side view of a different embodiment of tunable organic VCSEL system.

FIG. 18 is a cross-section side view of a different embodiment of a tunable organic VCSEL system 1050, which uses a material with a controllable refractive index to tune the laser wavelength. Individuals skilled in the art will recognize this embodiment as a combination of two tuning mechanisms; one mechanism involving tuning via the use of a material with a controllable refractive index to tune the laser wavelength; and a second mechanism involving the use of a MEMs device for changing the optical path length of the laser cavity. Additionally, persons skilled in the art will recognize that alternative combinations of tuning mechanisms are possible and considered within the scope of the invention. The tunable organic VCSEL system 1050 comprises a substrate 20. A pump beam 60 is provided below and passes through the substrate 20. A lower electrode 1010 is provided above the substrate 20, and must be transparent to the pump beam 60. The lower electrode 1010 can be, for example, ITO. Alternatively, an opaque lower electrode can be used in a configuration in which the pump beam 60 is provided from the top.

The bottom dielectric stack 30 and the organic active region 40 are respectively provided above the lower electrode 1010. The top dielectric stack 50 is provided above the organic active region 40, thereby defining the laser cavity. Between the bottom dielectric stack 30 and the top dielectric stack 50, a dielectric control layer 1020 is provided that is used to control the optical cavity length of the laser cavity. Because the laser wavelength is proportional to the optical cavity length, the laser wavelength is thereby tunable. A top electrode 1030 is provided above the top dielectric stack 50. A controller 1040 is provided to control the index of refraction of the dielectric control layer 1020.

In one embodiment, the dielectric control layer 1020 comprises a material with a variable index of refraction that is controlled by applying an electric field. Candidate materials are electro-optic materials, such as lithium niobate, or liquid crystal layers. The dielectric control layer 1020 has an index of refraction that varies with the applied electric field as $$n(E) = n_o + \frac{1}{2}n_o^3 rE$$

where E is the applied electric field, $n_o$ is the refractive index in the absence of the applied field, and r is the electro-optic coefficient. The controller 1040 for this embodiment is a voltage source applied between the top electrode 1030 and the lower electrode 1010.

In a second embodiment, the dielectric control layer 1020 comprises a photorefractive material. Lithium niobate doped with $Fe^{+3}$ is a candidate material. In this case, the controller 1040 is an optical source, such as a UV lamp, and the refractive index changes in response to the intensity.

As a third embodiment, the dielectric control layer 1020 comprises a material that is thermally sensitive, and the controller 1040 is a thermal source, such as a resistive heating element. The dielectric control layer can then modify the laser wavelength via thermal expansion and/or by thermally induced changes to the refractive index, i.e.

$$L_{opt}(\Delta T) = L_{opt,0} + n_{dc,o}\frac{\partial L_{dc}}{\partial T} + L_{dc,o}\frac{\partial n_{dc}}{\partial T},$$

where $\Delta T$ is the variation of the temperature from a steady-state temperature, $L_{opt,o}$ is the optical cavity length at the steady-state temperature, $n_{dc}$ is the refractive index of the dielectric control layer, and $L_{dc}$ is the physical thickness of the dielectric control layer.

In FIG. 18 a MEMs device is included for changing the optical path length of the laser cavity. The MEMs device is placed atop index matching layer or layers 240 and 250. The micro-electromechanical mirror assembly 310 consists of a bottom electrode 260, a support structure 270, a top electrode 275, support arms 272, an air gap 280, a mirror tether 285, and the top dielectric stack 290. Laser emission 70 occurs from the top dielectric stack 290. A voltage source (not shown) applied between the bottom electrode 260 and the top electrode 275 changes the thickness t, of the air gap 280 via electrostatic interaction and thereby varies the cavity length of the organic laser cavity device. Although the top dielectric stack 290 is depicted as having a finite curvature, those skilled in the art would recognize that substantially flat top dielectric stacks 290 may also be used and should be considered another embodiment of the present invention. Variation of t, the thickness of the air gap 280, changes the optical path length. The top dielectric stack 290 may include one or more index matching layers; these are not shown in FIG. 18. These index matching layers (including index matching layers 240 and 250) minimize optical reflections at the air gap 280 interface with adjacent layers and improve the efficiency of the device. The bottom electrode 260 and the top electrode 275 are fabricated from conductive materials, typically metals, and in a ring geometry. Transparent conductive electrodes, such as indium-tin-oxide (ITO) or polymer materials could also be used. If the optical losses of such latter materials are low, a ring geometry may not be required. Support structure 270 is typically aluminum, titanium—tungsten (Ti—W), or silicon nitride ($SiN_x$) with sufficient thickness to provide mechanical support. Typical thicknesses are 2000 nm for the support structure 270 and 100–200 nm for the mirror tether 285. The mirror tether 285 is made from similar materials but much thinner in order to be flexible under the action of the electrostatic field provided by the tuning voltage source. It may be necessary to have an additional electrical isolation layer (not shown) between the bottom electrode 260 and the mirror tether 285. This layer is fabricated from insulating material. The support structure 270 defines at least one support arm 272, which mechanically stabilizes the top dielectric stack 290 at the required distance t. In order to accomplish this, the support structure 270 must have a suitably large intrinsic tensile stress.

The invention has been described with reference to a preferred embodiment; however, it will be appreciated that variations and modifications can be effected by a person of ordinary skill in the art without departing from the scope of the invention.

| PARTS LIST: | |
|---|---|
| 10 | vertical cavity organic laser device |
| 20 | substrate |
| 30 | bottom dielectric stack |
| 40 | organic active region |
| 45 | multi-layered film structure |
| 50 | top dielectric stack |
| 60 | pump beam |
| 65 | source of photons |
| 70 | laser emission |
| 80 | vertical cavity organic laser device |
| 100 | periodic gain region |
| 103 | antinode |
| 105 | node |
| 110 | organic spacer layer |
| 120 | electromagnetic field pattern |
| 190 | phase-locked organic laser array |
| 200 | organic laser cavity devices |
| 210 | inter-pixel region |
| 211 | circular pillar |
| 220 | etched region |
| 230 | optically pumped tunable organic VCSEL system |
| 232 | optically pumped tunable organic VCSEL system |
| 234 | optically pumped tunable organic VCSEL system |
| 236 | optically pumped tunable organic VCSEL system |
| 240 | index matching layer |
| 250 | index matching layer |
| 260 | bottom electrode |
| 270 | support structure |
| 272 | support arm |
| 273 | release hole |
| 275 | top electrode |
| 280 | air gap |
| 285 | mirror tether |
| 290 | top dielectric stack |
| 300 | multi-layered film structure |
| 310 | micro-electromechanical mirror assembly |
| 320 | optically pumped tunable organic VCSEL system |
| 330 | multi-layered film structure |
| 340 | tapered micro-cavity device |
| 350 | wedge organic active region |
| 360 | left edge |
| 370 | right edge |
| 380 | bottom mirror |
| 390 | top mirror |
| 400 | electrically pumped organic vertical cavity laser |
| 410 | organic active region |
| 420 | hole transport layer |
| 430 | emissive layer |
| 440 | electron transport layer |
| 450 | electrode |
| 460 | electrode |
| 470 | current source |
| 480 | electrically pumped organic vertical cavity laser |
| 500 | block diagram |
| 510 | block, pump source |
| 520 | block, organic vertical laser devices |
| 530 | block, beam direction optics |

-continued

PARTS LIST:

| | |
|---|---|
| 540 | block, micro-electromechanical mirror assembly |
| 550 | block, beam direction optics |
| 560 | block, laser light output selection |
| 565 | tunable organic VCSEL system |
| 570 | current source |
| 580 | organic vertical cavity laser device structure |
| 590 | selected optical rays |
| 600 | non-selected optical rays |
| 610 | beam direction optics |
| 620 | mirror assembly |
| 630 | beam direction optics |
| 640 | output selection fiber |
| 650 | non-selected output |
| 660 | system output |
| 670 | aperture |
| 680 | photon source |
| 690 | pump beam light |
| 700 | organic vertical cavity laser device structure |
| 702 | optically pumped tunable organic VCSEL system |
| 704 | grating assembly |
| 705 | optically pumped multi-layered film structure |
| 710 | index matching layer or layers |
| 715 | light output |
| 720 | optics |
| 730 | pivot point |
| 740 | substrate attachment points |
| 750 | suspension beams |
| 760 | rotary comb drive |
| 770 | rotary motor frame |
| 780 | movable mirror |
| 790 | diffraction grating |
| 791 | flexible grating structure |
| 792 | electrically tunable grating |
| 793 | membrane grating |
| 794 | deformable membrane |
| 797 | comb-drive linear motor |
| 799 | piezoelectric actuator |
| 800 | laser output beam |
| 810 | diffracted beam |
| 820 | electrically pumped multi-layered film structure |
| 900 | electro-optic grating |
| 910 | fixed grating |
| 920 | electro-optic layer |
| 930 | conductive layer |
| 932 | conductive layer |
| 934 | substrate |
| 936 | substrate |
| 1000 | organic vertical cavity laser device structure |
| 1010 | lower electrode |
| 1020 | dielectric control layer |
| 1030 | top electrode |
| 1040 | controller |
| 1050 | tunable organic VXCEL system |

What is claimed is:

1. A system for mechanically tuning optical wavelengths emitted from an organic laser cavity device, comprising:
   a) a multi-layered film structure having a periodically structured active region, wherein the multi-layered film structure is pumped by an incoherent source of photons; and
   b) a micro-electromechanical mirror assembly proximate to the multi-layered film structure, wherein the micro-electromechanical mirror assembly varies the cavity length of the organic laser cavity device.

2. The system claimed in claim 1, further comprising:
   c) a plurality of supports for the micro-electromechanical mirror assembly with an air gap in between the plurality of supports;
   d) a top electrode layer in contact with the micro-electromechanical mirror assembly; and
   e) a bottom electrode layer.

3. The system claimed in claim 1, wherein the micro-electromechanical minor assembly is a cantilevered assembly.

4. The system claimed in claim 1, wherein the micro-electromechanical minor assembly is a membrane assembly.

5. The system claimed in claim 1, wherein the micro-electromechanical mirror assembly includes at least one doubly supported beam.

6. The system claimed in claim 1, wherein an optical wavelength is determined by the variable cavity length of the organic laser cavity device according to the mathematical relationship $n\lambda/2 = L_{opt}$.

7. The system claimed in claim 1, further comprising:
   an index matching layer or layers placed atop the multi-layered film structure.

8. The system claimed in claim 1, further comprising:
   an index matching layer or layers integrated within the micro-electromechanical mirror assembly.

9. The system claimed in claim 8, wherein the index matching layer or layers is closest to the multi-layered film structure.

10. The system claimed in claim 1, wherein the incoherent source of photons is a light emitting diode.

11. The system claimed in claim 1, wherein the incoherent source of photons is a lamp.

12. The system claimed in claim 1, wherein the incoherent source of photons is a light source other than a light emitting diode.

13. A system for mechanically tuning optical wavelengths emitted from an organic laser cavity device, comprising:
   a) an organic vertical cavity laser device structure, having a periodically structured active region, that includes an array of organic vertical cavity laser devices, patterned on a single substrate, and pumped by a means of excitation such that the plurality of organic vertical cavity laser devices provides a plurality of optical wavelengths; and
   b) a mirror assembly that receives the plurality of optical wavelengths from the organic vertical cavity laser device structure and directs a selected band of optical wavelengths to a system output.

14. The system claimed in claim 13, wherein the organic vertical cavity laser device structure is an array of fixed wavelength organic laser cavity devices.

15. The system claimed in claim 13, wherein the organic vertical cavity laser device structure is an array of tunable wavelength organic laser cavity devices.

16. The system claimed in claim 13, wherein the means of excitation include optical pumping means.

17. The system claimed in claim 13, wherein the excitation means includes a laser source.

18. The system claimed in claim 13, wherein the excitation means includes a light emitting diode.

19. The system claimed in claim 13, wherein the excitation means includes incoherent light sources other than a light emitting diode.

20. The system claimed in claim 13, wherein the excitation means includes electrical injection.

21. A system for tuning optical wavelengths emitted from an organic laser cavity device, comprising:
   a) an organic laser cavity structure pumped by a means of excitation, wherein the organic laser cavity structure includes:
      a1) a support;
      a2) a first dielectric stack for receiving and transmitting pump beam light and being reflective to laser light over a predetermined range of wavelengths;

a3) one or more dielectric control layers with controllable index of refraction;

a4) periodically structured organic active region for receiving transmitted pump beam light from the first dielectric stack and emits laser light; and a5) a second dielectric stack for reflecting transmitted pump beam light and laser light from the organic active region back into the organic active region, wherein a combination of the first and the second dielectric stacks and the organic active region produces the laser light; and b) means for controlling the index refraction of he dielectric control layers.

22. The system claimed in claim 21, wherein the dielectric control layers are electro-optic and the means for controlling the index refraction is an applied electric field.

23. The system claimed in claim 21, wherein the dielectric control layers are photo-refractive and the means for controlling the index refraction is a source of photons.

24. The system claimed in claim 21, wherein the dielectric control layers include a temperature dependent index of refraction and the means for controlling the index refraction is a thermal source.

25. A system for turning optical wavelengths emitted form an organic laser cavity device, comprising:

a) a multi-layered film structure, wherein the multi-layered film structure is pumped by a source of photons and includes:

a1) a support;

a2) a first dielectric stack for receiving and transmitting pump beam light and being reflective to laser light over a predetermined range of wavelengths;

a3) one or more dielectric control layers with controllable index of refraction;

a4) periodically structured organic active region for receiving transmitted pump beam light from the first dielectric stack and emits laser light; and a5) a second dielectric stack for reflecting transmitted pump beam light and laser light from the organic active region back into the organic active region, wherein a combination of the first and the second dielectric stacks and the organic active region produces the laser light;

b) a micro-electromechanical mirror assembly proximate to the multi-layered film structure, wherein the micro-electromechanical mirror assembly varies a cavity length of the organic laser cavity device; and c) means for controlling the index refraction of the dielectric control layers.

26. The system claimed in claim 25, further comprising:

c) a plurality of supports for the micro-electromechanical mirror assembly with an air gap in between the plurality of supports;

d) a top electrode layer in contact with the micro-electromechanical mirror assembly; and e) a bottom electrode layer.

27. The system claimed in claim 25, wherein the micro-electromechanical mirror assembly is a cantilevered assembly.

28. The system claimed in claim 25, wherein the micro-electromechanical mirror assembly is a membrane assembly.

29. The system claimed in claim 25, wherein the micro-electromechanical mirror assembly includes at least one doubly supported beam.

30. The system claimed in claim 25, wherein an optical wavelength is determined by the variable cavity length of the organic laser cavity device.

31. The system claimed in claim 25, further comprising: an index matching layer or layers placed atop the multi-layered film structure.

32. The system claimed in claim 25, further comprising: an index matching layer or layers integrated within the micro-electromechanical mirror assembly.

33. The system claimed in claim 32, wherein the index matching layer or layers is closest to the multi-layered film structure.

34. The system claimed in claim 25, wherein the source of photons is a light emitting diode.

35. The system claimed in claim 25, wherein the source of photons is a laser.

36. The system claimed in claim 25, wherein the source of photons is an incoherent light source other than a light emitting diode.

37. The system claimed in claim 25, wherein the dielectric control layers are electro-optic and the means for controlling the index refraction is an applied electric field.

38. The system claimed in claim 25, wherein the dielectric control layers are photo-refractive and the means for controlling the index refraction is a source of photons.

39. The system claimed in claim 25, wherein the dielectric control layers include a temperature dependent index of refraction and the means for controlling the index refraction is a thermal source.

40. A system for tuning optical wavelengths emitted from an organic laser cavity device, comprising:

a) a multi-layered film structure, wherein the multi-layered film structure is pumped by an incoherent source of photons and includes:

a1) a support;

a2) a first dielectric stack for receiving and transmitting pump beam light and being reflective to laser light over a predetermined range of wavelengths;

a3) a periodically-structure organic active region for receiving transmitted pump beam light from the first dielectric stack and emits the laser light; and a4) at least one index matching layer;

b) a grating assembly proximate to the multi-layered film structure, wherein the grating assembly varies a cavity length of the organic laser cavity device; and c) a controller for tuning the optical wavelengths emitted from the organic laser cavity device.

41. The system for tuning optical wavelengths claimed in claim 40 wherein the grating assembly is selected from the group consisting of: a Littman-Metcalf configuration, a Littrow configuration, and an electrically tunable grating.

42. The system for tuning optical wavelengths claimed in claim 40, wherein the incoherent source of photons is a light emitting diode.

43. The system claimed in claim 40, wherein the incoherent source of photons is a lamp.

44. The system claimed in claim 40, wherein the incoherent source of photons is a light source other than a light emitting diode.

45. The system claimed in claim 40, wherein the controller rotates a movable mirror for tuning the optical wavelengths.

46. The system claimed in claim 40, wherein the controller changes a period of an electrically tunable grating.

47. The system claimed in claim 40, wherein the controller alters an index of refraction of an electro-optic layer.

48. A system for tuning optical wavelengths emitted from an organic laser cavity device, comprising:

a) a multi-layered film structure, wherein the multi-layered film structure is electrically excited and includes:

a1) a support;

a2) a first dielectric stack for receiving and transmitting pump beam light and being reflective to laser light over a predetermined range of wavelengths;

a3) a periodically structure organic active region for receiving transmitted pump beam light from the first dielectric stack and emits the laser light; and a4) at least one index matching layer;

b) a grating assembly proximate to the multi-layered film structure, wherein the grating assembly varies a cavity length of the organic laser cavity device; and c) a controller for tuning the optical wavelengths emitted from the organic laser cavity device.

49. The system for tuning optical wavelengths claimed in claim 48 wherein the grating assembly is selected from the group consisting of: a Littman-Metcalf configuration, a Littrow configuration, and an electrically tunable grating.

50. The system claimed in claim 48, wherein the controller rotates a movable mirror for tuning the optical wavelengths.

51. The system claimed in claim 48, wherein the controller changes a period of an electrically tunable grating.

52. The system claimed in claim 48, wherein the controller alters an index of refraction of an electro-optic layer.

* * * * *

UNITED STATES PATENT AND TRADEMARK OFFICE
CERTIFICATE OF CORRECTION

PATENT NO. : 6,970,488 B2
DATED : November 29, 2005
INVENTOR(S) : Spoonhower et al.

It is certified that error appears in the above-identified patent and that said Letters Patent is hereby corrected as shown below:

<u>Column 25,</u>
Line 67, add -- [according to a mathematical relationship $n(\lambda/2)=L_{opt}$] -- after "device".

Signed and Sealed this

Twenty-first Day of March, 2006

JON W. DUDAS
*Director of the United States Patent and Trademark Office*